(12) United States Patent
Hotta et al.

(10) Patent No.: US 11,271,491 B2
(45) Date of Patent: Mar. 8, 2022

(54) INVERTER MODULE

(71) Applicants: AISIN AW CO., LTD., Anjo (JP); AISIN SEIKI KABUSHIKI KAISHA, Kariya (JP)

(72) Inventors: Yutaka Hotta, Chiryu (JP); Tomoyuki Suzuki, Anjo (JP); Kaoru Shimano, Anjo (JP); Yasuhiro Kume, Takahama (JP); Takeshi Ikeyama, Nagoya (JP); Toshiyuki Fukuhara, Nagoya (JP)

(73) Assignee: AISIN CORPORATION, Kariya (JP)

( * ) Notice: Subject to any disclaimer, the term of this patent is extended or adjusted under 35 U.S.C. 154(b) by 208 days.

(21) Appl. No.: 16/637,389

(22) PCT Filed: Sep. 10, 2018

(86) PCT No.: PCT/JP2018/033462
§ 371 (c)(1),
(2) Date: Feb. 7, 2020

(87) PCT Pub. No.: WO2019/065184
PCT Pub. Date: Apr. 4, 2019

(65) Prior Publication Data
US 2020/0204083 A1 Jun. 25, 2020

(30) Foreign Application Priority Data

Sep. 27, 2017 (JP) .............................. JP2017-187032
Jan. 31, 2018 (JP) .............................. JP2018-015927

(51) Int. Cl.
*H02M 7/48* (2007.01)
*H02M 7/00* (2006.01)
(Continued)

(52) U.S. Cl.
CPC ............ *H02M 7/003* (2013.01); *H01L 25/18* (2013.01); *H02M 7/515* (2013.01)

(58) Field of Classification Search
CPC ........ H02M 7/48; H02M 7/003; H02M 7/515; H01L 23/48; H01L 25/07; H01L 25/18
See application file for complete search history.

(56) References Cited

U.S. PATENT DOCUMENTS

2007/0018197 A1 1/2007 Mochida et al.
2010/0148298 A1 6/2010 Takano et al.
(Continued)

FOREIGN PATENT DOCUMENTS

JP 2005-012028 A 1/2005
JP 2007-329428 A 12/2007
(Continued)

OTHER PUBLICATIONS

International Search Report of PCT/JP2018/033462 dated Oct. 23, 2018[PCT/ISA/210].
(Continued)

*Primary Examiner* — Adolf D Berhane
(74) *Attorney, Agent, or Firm* — Sughrue Mion, PLLC

(57) ABSTRACT

In an inverter module (10) including a plurality of switching elements (11), a positive-polarity bus bar (14), a negative-polarity bus bar (15), and a plurality of output bus bars (16, 17, and 18), the plurality of output bus bars (16, 17, and 18) are disposed in a first direction (D1) in which upper-stage-side switching elements (11U) and lower-stage-side switching elements (11L) are placed side by side, and the positive-polarity bus bar (14) and the negative-polarity bus bar (15) are disposed in a second direction (D2) intersecting the first direction (D1).

20 Claims, 13 Drawing Sheets

(51) Int. Cl.
    *H01L 25/18*     (2006.01)
    *H02M 7/515*     (2007.01)

(56) References Cited

U.S. PATENT DOCUMENTS

| 2014/0035112 | A1  | 2/2014 | Kadoguchi et al. |
| 2020/0220479 | A1* | 7/2020 | Miyazaki ................. B60L 53/22 |
| 2020/0220489 | A1* | 7/2020 | Nakamura ............ H02M 7/003 |
| 2020/0259425 | A1* | 8/2020 | Shimada ................. H02P 27/06 |
| 2020/0295672 | A1* | 9/2020 | Okubo .................... H02M 1/44 |
| 2021/0297016 | A1* | 9/2021 | Takii ....................... H02P 29/50 |

FOREIGN PATENT DOCUMENTS

| JP | 2009-033902 A | 2/2009 |
| JP | 2013-089828 A | 5/2013 |
| JP | 2016-111271 A | 6/2016 |

OTHER PUBLICATIONS

Supplementary European Search Report dated Jun. 19, 2020, from the European Patent Office in Application No. 18860338.5.

* cited by examiner

INVERTER MODULE

CROSS REFERENCE TO RELATED APPLICATIONS

This application is a National Stage of International Application No. PCT/JP2018/033462, filed Sep. 10, 2018, claiming priorities to Japanese Patent Application No. 2017-187032, filed Sep. 27, 2017 and Japanese Patent Application No. 2018-015927, filed Jan. 31, 2018 the disclosure of which is incorporated herein by reference in its entirety.

TECHNICAL FIELD

The present disclosure relates to an inverter module.

BACKGROUND ART

To convert electric power between direct current and alternating current of a plurality of phases, an inverter device is used. The inverter device may be configured to include an inverter module in which a plurality of switching elements, a positive-polarity bus bar, a negative-polarity bus bar, and a plurality of output bus bars are formed into a module. An example of such an inverter module is disclosed in, for example, JP 2007-329428 A (Patent Literature 1).

In an inverter module of Patent Literature 1, for each pair of switching elements for each of a plurality of phases, a positive-polarity bus bar and a negative-polarity bus bar are disposed so as to extend in parallel to each other, and an output bus bar is disposed so as to extend between the bus bars in the same direction. By providing a number of inverter modules having such a configuration that corresponds to the number of the plurality of phases, an inverter device is formed.

Patent Literature 1 states, as an advantageous effect, that the inductance of an inverter circuit can be reduced by the above-described configuration, but on the other hand, there has been a drawback that the overall size tends to increase because a plurality of inverter modules are provided separately.

CITATIONS LIST

Patent Literature

Patent Literature 1: JP 2007-329428 A

SUMMARY OF DISCLOSURE

Technical Problems

It is desired to implement an inverter module whose overall miniaturization is easily achieved.

Solutions to Problems

An inverter module according to the present disclosure is an inverter module including a plurality of switching elements included in an inverter circuit for converting electric power between direct current and alternating current of a plurality of phases; a positive-polarity bus bar; a negative-polarity bus bar; and a plurality of output bus bars for the respective plurality of phases, and the plurality of switching elements include upper-stage-side switching elements and lower-stage-side switching elements for the respective plurality of phases, a corresponding one of the upper-stage-side switching elements and a corresponding one of the lower-stage-side switching elements for each phase are disposed side by side in a first direction, the plurality of upper-stage-side switching elements are disposed side by side in a second direction intersecting the first direction, and the plurality of lower-stage-side switching elements are disposed side by side in the second direction, the positive-polarity bus bar is disposed in the second direction being in contact with first surfaces of the plurality of upper-stage-side switching elements, the negative-polarity bus bar is disposed in the second direction being in contact with second surfaces of the plurality of lower-stage-side switching elements, the second surfaces being on an opposite side of first surfaces of the plurality of lower-stage-side switching elements, the output bus bars for the respective plurality of phases are disposed in the first direction being in contact with second surfaces of the upper-stage-side switching elements for corresponding phases, and being in contact with the first surfaces of the lower-stage-side switching elements for corresponding phases, the second surfaces being in an opposite side of the first surfaces of the upper-stage-side switching elements, and upper-stage output opposite junction surface parts of the output bus bars for the respective plurality of phases and a negative-polarity opposite junction surface part of the negative-polarity bus bar are disposed on a same plane, or lower-stage output opposite junction surface parts of the output bus bars for the respective plurality of phases and a positive-polarity opposite junction surface part of the positive-polarity bus bar are disposed on a same plane, the upper-stage output opposite junction surface parts being on an opposite side of surfaces of the output bus bars that are in contact in a thickness direction with the upper-stage-side switching elements, the negative-polarity opposite junction surface part being on an opposite side of a surface of the negative-polarity bus bar that is in contact in a thickness direction with the lower-stage-side switching elements, the lower-stage output opposite junction surface parts being on an opposite side of surfaces of the output bus bars that are in contact in a thickness direction with the lower-stage-side switching elements, and the positive-polarity opposite junction surface part being on an opposite side of a surface of the positive-polarity bus bar that is in contact in a thickness direction with the upper-stage-side switching elements.

According to this configuration, the plurality of switching elements are disposed aligned in "two columns×a number of columns corresponding to the number of phases". A single positive-polarity bus bar is connected to the plurality of upper-stage-side switching elements, a single negative-polarity bus bar is connected to the plurality of lower-stage-side switching elements, and the output bus bars are respectively connected to pairs of the upper-stage-side switching elements and the lower-stage-side switching elements for the respective phases. Since the plurality of switching elements, the positive-polarity bus bar, the negative-polarity bus bar, and the plurality of output bus bars are disposed so as to be put together in a cluster with a minimal number of components, it becomes easier to achieve miniaturization of the entire inverter module and to improve the mountability of the inverter module. In addition, since the upper-stage output opposite junction surface parts and the negative-polarity opposite junction surface part, or the lower-stage output opposite junction surface parts and the positive-polarity opposite junction surface part are disposed on the same plane, in terms of this point, too, miniaturization of the entire inverter module is easily achieved.

Further features and advantages of a technique according to the present disclosure will become more apparent from the following description of illustrative and non-restrictive embodiments which are described with reference to drawings.

DESCRIPTION OF EMBODIMENTS

First Embodiment

A first embodiment of an inverter module and an inverter unit including the inverter module will be described with reference to the drawings. An inverter unit 1 and an inverter module 10 of the present embodiment are used mounted on a rotating electrical machine control system that controls a rotating electrical machine 5 that operates as a vehicle's (wheels') drive power source on, for example, an electric vehicle or a hybrid vehicle. The rotating electrical machine 5 of the present embodiment is an alternating-current rotating electrical machine that uses a direct-current power supply 2 as an electric power source, and is driven by alternating current of a plurality of phases (as an example, three phases including a U-phase, a V-phase, and a W-phase).

Figure 1:
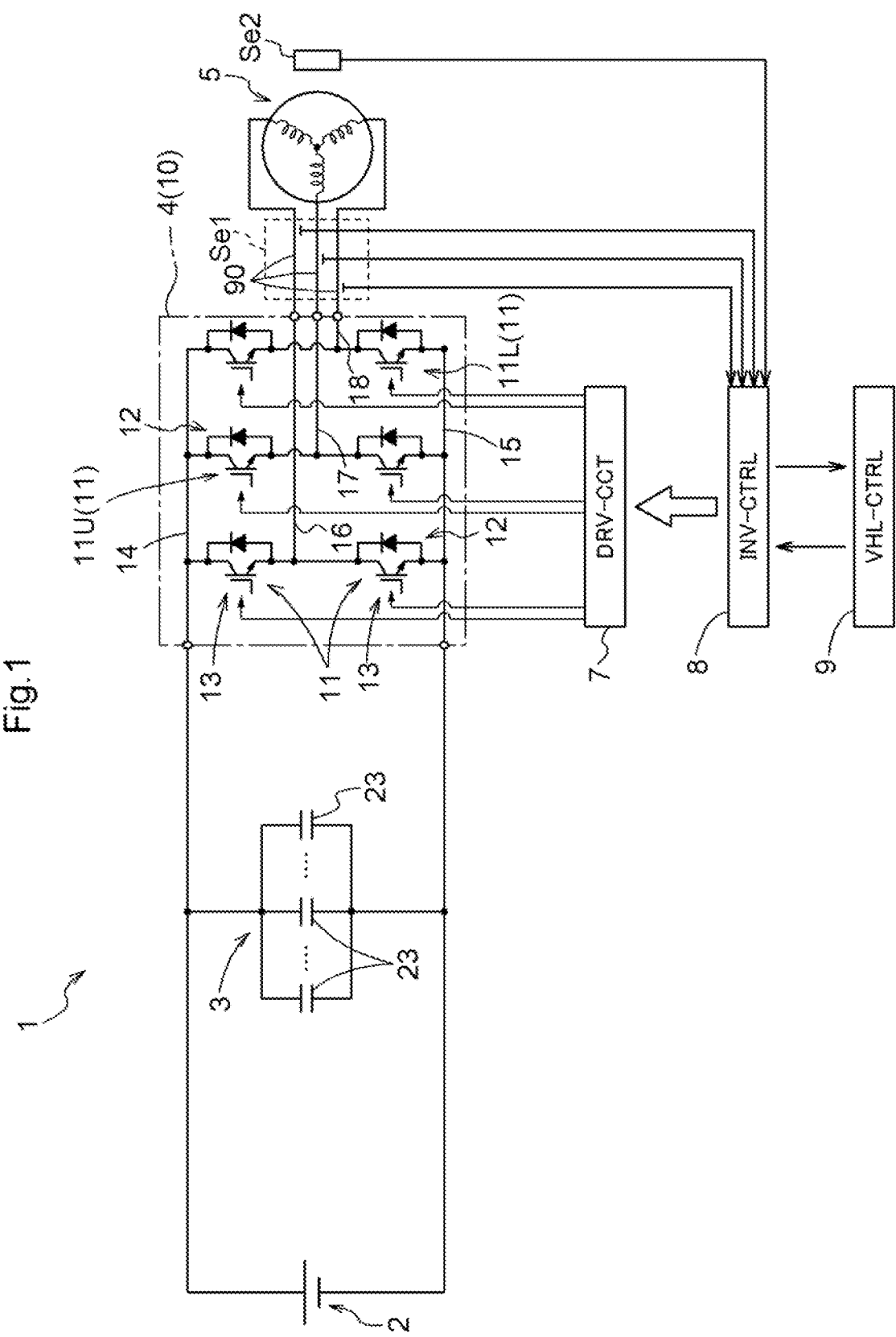
FIG. 1 is a circuit block diagram of an inverter unit according to a first embodiment.

As shown in FIG. 1, an inverter circuit 4 is provided between the direct-current power supply 2 and the rotating electrical machine 5. The inverter circuit 4 converts electric power between direct current and alternating current of a plurality of phases. The inverter circuit 4 includes a plurality of switching elements 11 as the core thereof. A capacitor 3 is provided between the direct-current power supply 2 and the inverter circuit 4. The capacitor 3 smooths a voltage on a direct-current side of the inverter circuit 4.

The plurality of switching elements 11 include upper-stage-side switching elements 11U connected to a positive polarity of the direct-current power supply 2; and lower-stage-side switching elements 11L connected to a negative polarity of the direct-current power supply 2. For each phase (the U-phase, the V-phase, and the W-phase), an upper-stage-side switching element 11U is connected in series with a lower-stage-side switching element 11L, by which one arm is formed, and a midpoint of each arm is connected to a stator coil for a corresponding phase of the rotating electrical machine 5. Note that in the following description and accompanying drawings (e.g., FIG. 4), an upper-stage-side switching element 11U for the U-phase may be indicated by reference sign "11Uu", an upper-stage-side switching element 11U for the V-phase may be indicated by reference sign "11Uv", and an upper-stage-side switching element 11U for the W-phase may be indicated by reference sign "11Uw". Likewise, a lower-stage-side switching element 11L for the U-phase may be indicated by reference sign "11Lu", a lower-stage-side switching element 11L for the V-phase may be indicated by reference sign "11Lv", and a lower-stage-side switching element 11L for the W-phase may be indicated by reference sign "11Lw".

For the switching elements 11, power semiconductor devices that can operate at high frequencies can be suitably used. As preferred examples, for example, insulated gate bipolar transistors (IGBTs) and power metal oxide semiconductor field effect transistors (MOSFETs) can be exemplified. Alternatively, silicon carbide-metal oxide semiconductor FETs (SiC-MOSFETs), SiC-static induction transistors (SiC-SITs), gallium nitride-MOSFETs (GaN-MOSFETs), etc., can also be exemplified. FIG. 1 exemplifies a mode in which IGBTs are used as the switching elements 11.

A diode 12 for rectification is connected in parallel to each switching element 11. In the present embodiment, the switching elements 11 (11Uu, 11Uv, 11Uw, 11Lu, 11Lv, and 11Lw) each are formed of a chip-type element including the diode 12. The chip-type element including the switching element 11 and the diode 12 is formed in a rectangular shape close to a square (e.g., the aspect ratio is on the order of 0.8 to 1.2).

A control terminal 13 of each switching element 11 (e.g., a gate terminal of an IGBT) included in the inverter circuit 4 is connected to an inverter control device 8 (INV-CTRL) through a drive circuit 7 (DRV-CCT). The inverter control device 8 performs, for example, current feedback control using a vector control method, based on target torque of the rotating electrical machine 5 which is provided from a higher-level vehicle control device 9 (VHL-CTRL). Actual currents flowing through the stator coils for the respective phases of the rotating electrical machine 5 are detected by a current sensor Se1, and a magnetic pole position at each time point of a rotor of the rotating electrical machine 5 is detected by a rotation sensor Se2. The inverter control device 8 performs individual switching control of the switching elements 11 by performing current feedback control using results of the detection by the current sensor Se1 and the rotation sensor Se2.

Figure 2:
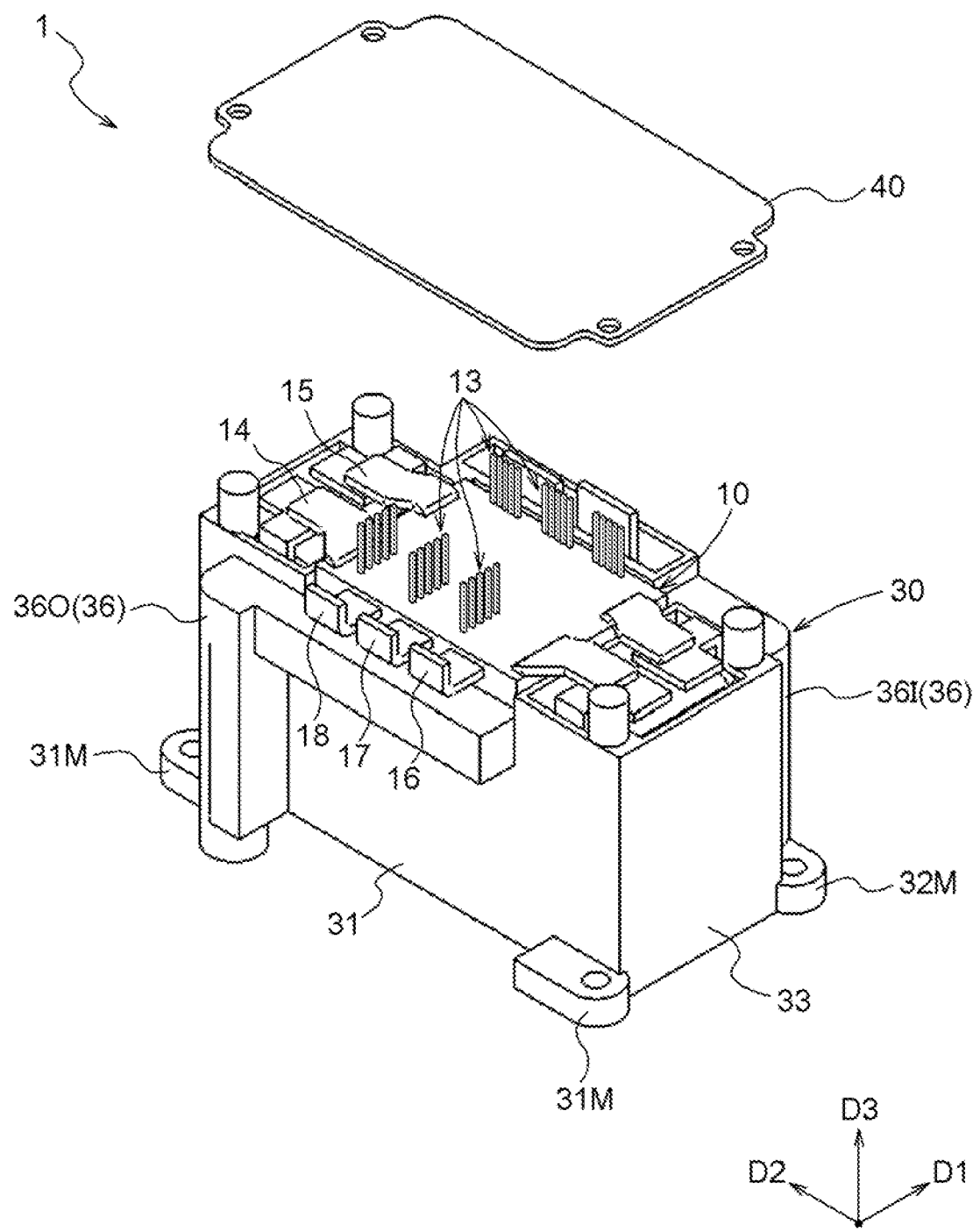
FIG. 2 is a perspective view of the inverter unit.
Figure 3:
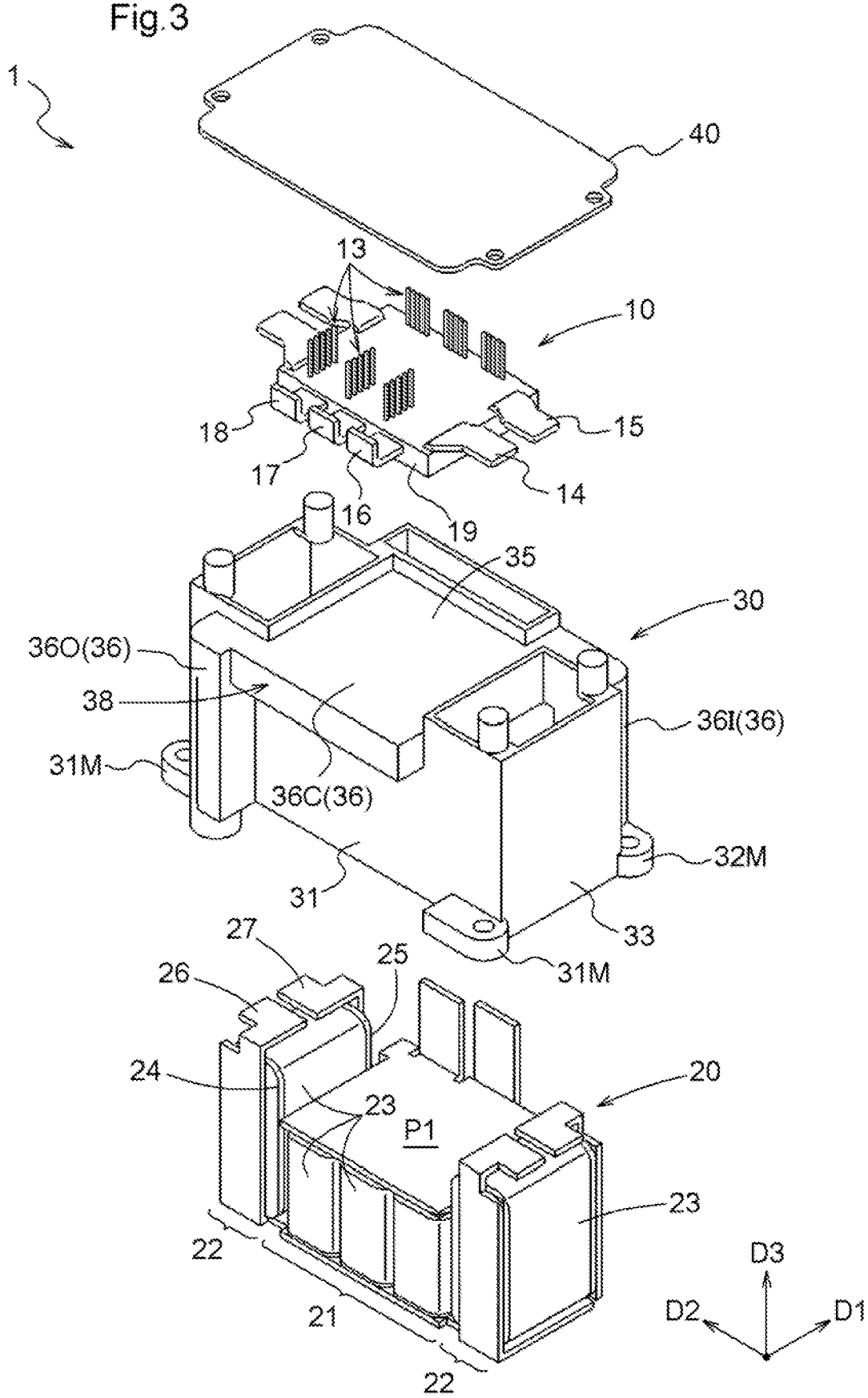
FIG. 3 is an exploded perspective view of the inverter unit.

As shown in FIGS. 2 and 3, the inverter unit 1 includes the inverter module 10, a capacitor module 20, a capacitor case 30, and a control board 40 which are formed into a single unit. The inverter unit 1 is formed as a single-piece unit that is formed in a compact rectangular parallelepiped shape as a whole.

The inverter module 10 is a module including the plurality of switching elements 11 which are included in the inverter circuit 4. Note that as described above, in the present embodiment, the switching elements 11 each are formed of a chip-type element including the diode 12, and in the following, when the "switching elements 11" are referred to regarding the inverter module 10, it includes the meaning of "chip-type elements". The inverter module 10 includes a positive-polarity bus bar 14, a negative-polarity bus bar 15, and a plurality of output bus bars, in addition to the plurality of switching elements 11. When, as in the present embodiment, the rotating electrical machine 5 is configured to be driven by alternating current of three phases, a first output bus bar 16, a second output bus bar 17, and a third output bus bar 18 are provided as the plurality of output bus bars. For example, the first output bus bar 16 can be used for the U-phase, the second output bus bar 17 can be used for the V-phase, and the third output bus bar 18 can be used for the W-phase. A single positive-polarity bus bar 14 and a single negative-polarity bus bar 15 are provided.

The switching elements 11, the positive-polarity bus bar 14, the negative-polarity bus bar 15, and the output bus bars 16, 17, and 18 are formed into a single unit, being buried at least partially in a main body part 19 made of, for example, a mold resin. Sets of control terminals 13 of the switching elements 11 and connection terminal portions of each of the positive-polarity bus bar 14, the negative-polarity bus bar 15, and the output bus bars 16, 17, and 18 protrude from the main body part 19. Note that FIG. 4 shows the states of the switching elements 11, the sets of control terminals 13, the positive-polarity bus bar 14, the negative-polarity bus bar 15, and the output bus bars 16, 17, and 18 inside the main body part 19 in an exploded perspective manner.

Figure 4:
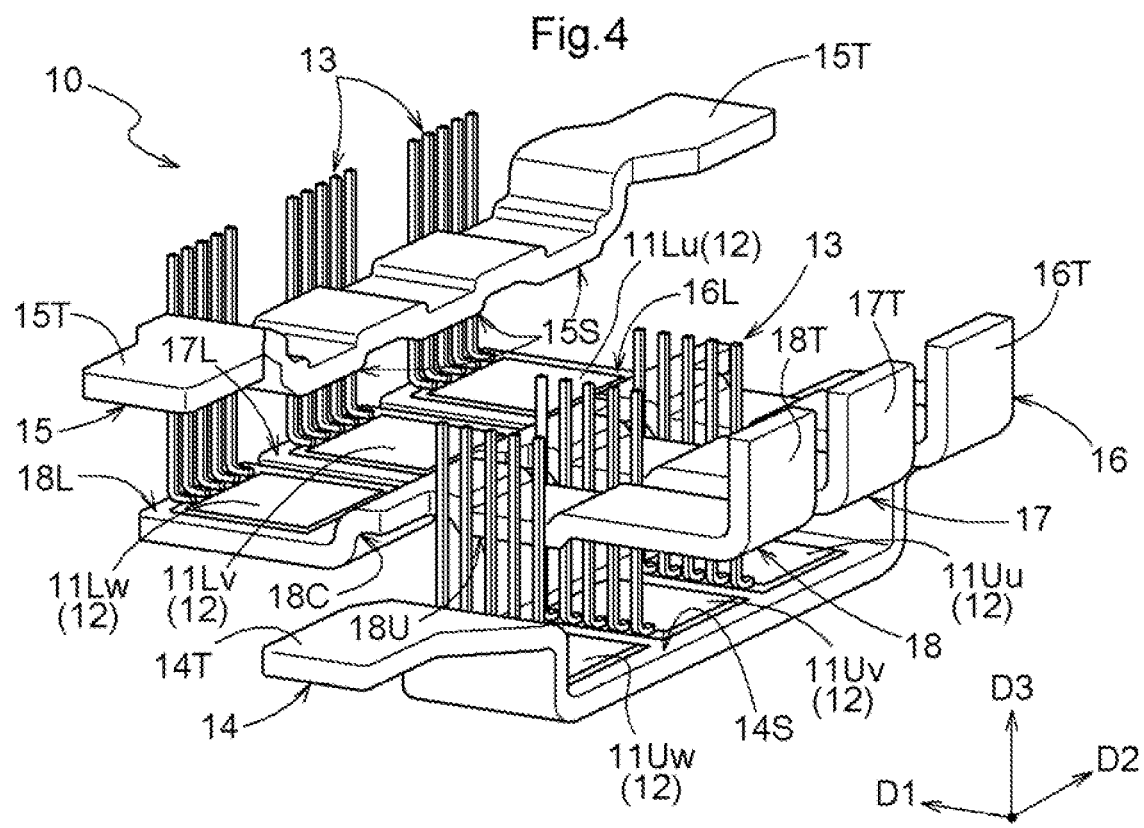
FIG. 4 is an exploded perspective view of an inverter module.
Figure 5:
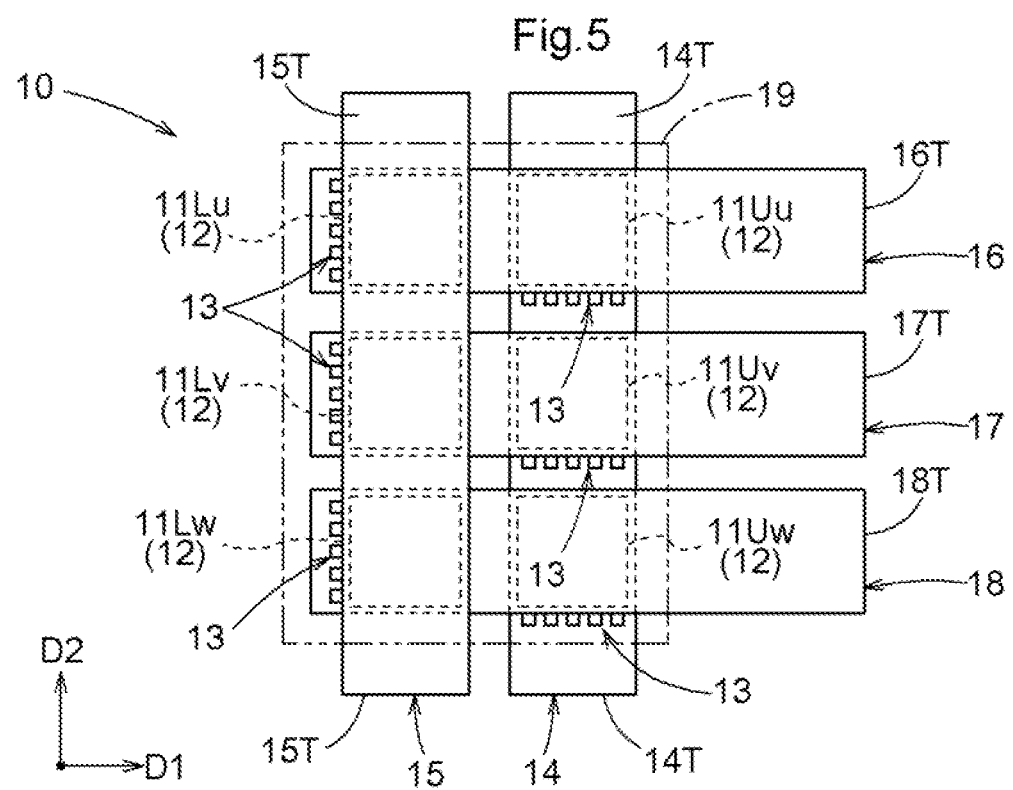
FIG. 5 is a plan view of the inverter module.

As shown in FIGS. 4 and 5, an upper-stage-side switching element 11U and a lower-stage-side switching element 11L for each phase are disposed side by side in a first direction D1. The upper-stage-side switching element 11Uu and the lower-stage-side switching element 11Lu for the U-phase are disposed side by side in the first direction D1, the upper-stage-side switching element 11Uv and the lower-stage-side switching element 11Lv for the V-phase are disposed side by side in the first direction D1, and the upper-stage-side switching element 11Uw and the lower-stage-side switching element 11Lw for the W-phase are disposed side by side in the first direction D1.

The upper-stage-side switching elements 11U and the lower-stage-side switching elements 11L for the respective phases are disposed side by side in a second direction D2 intersecting the first direction D1. The upper-stage-side switching elements 11U for the respective phases are disposed on the same plane. Likewise, the lower-stage-side switching elements 11L for the respective phases are disposed on the same plane. Namely, the upper-stage-side switching element 11Uu for the U-phase, the upper-stage-side switching element 11Uv for the V-phase, and the upper-stage-side switching element 11Uw for the W-phase are disposed side by side in the second direction D2 on the same plane. In parallel to them, the lower-stage-side switching element 11Lu for the U-phase, the lower-stage-side switching element 11Lv for the V-phase, and the lower-stage-side switching element 11Lw for the W-phase are disposed side by side in the second direction D2 on the same plane. Furthermore, in the present embodiment, the upper-stage-side switching elements 11U and the lower-stage-side switching elements 11L for the respective phases are disposed on the same plane.

In this manner, all (six in this example) switching elements 11 included in the inverter circuit 4 are disposed in a matrix of two columns×three columns on the same plane. In the present embodiment, the angle of intersection of the first direction D1 and the second direction D2 is set to 90°. Namely, the first direction D1 and the second direction D2 are orthogonal to each other. Note that in the present embodiment a direction orthogonal to both the first direction D1 and the second direction D2 is defined as a "third direction D3" and used in the following description. Note that in the following description a control board 40 side in the third direction D3 may be referred to as "top" and the opposite side thereof as "bottom", but it does not necessarily mean that they match "top" and "bottom" in a vertical direction.

The positive-polarity bus bar 14, the negative-polarity bus bar 15, and the output bus bars 16, 17, and 18 each are disposed in the following mode with respect to the six switching elements 11 which are disposed aligned in two columns×three columns on the same plane. The positive-polarity bus bar 14 is disposed in the second direction D2 being in contact with undersurfaces of the plurality of upper-stage-side switching elements 11U. In the present embodiment, the undersurface of each upper-stage-side switching element 11U corresponds to a "first surface" of the upper-stage-side switching element 11U. In addition, a plurality of positive-polarity junction surface parts 14S of the positive-polarity bus bar 14 that serve as contacts with the undersurfaces (first surfaces) of the respective upper-stage-side switching elements 11U have a common flat surface, and are thereby disposed on the same plane. The undersurfaces of the respective upper-stage-side switching elements 11U are joined to top surfaces of the positive-polarity junction surface parts 14S, with the undersurfaces and the top surfaces being in contact with each other. Both end parts in the second direction D2 of the positive-polarity bus bar 14 are disposed protruding outward in the second direction D2, with the both end parts being offset in the third direction D3 relative to the positive-polarity junction surface parts 14S present at a central portion, and each end part serves as a positive-polarity terminal part 14T.

The negative-polarity bus bar 15 is disposed in the second direction D2 being in contact with top surfaces of the plurality of lower-stage-side switching elements 11L. In the present embodiment, a top surface of each lower-stage-side switching element 11L corresponds to a "second surface" of the lower-stage-side switching element 11L. In addition, a plurality of negative-polarity junction surface parts 15S of the negative-polarity bus bar 15 that serve as contacts with the top surfaces (second surfaces) of the respective lower-stage-side switching elements 11L are disposed on the same plane while connected to each other through recessed and projected connecting parts. The top surfaces of the respective lower-stage-side switching elements 11L are joined to undersurfaces of the negative-polarity junction surface parts 15S, with the top surfaces and the undersurfaces being in contact with each other. Both end parts in the second direction D2 of the negative-polarity bus bar 15 are disposed protruding outward in the second direction D2, with the both end parts being offset in the third direction D3 relative to the negative-polarity junction surface parts 15S present at a central portion, and each end part serves as a negative-polarity terminal part 15T.

As such, in the present embodiment, the positive-polarity bus bar 14 and the negative-polarity bus bar 15 have the terminal parts 14T and 15T, respectively, on both sides in the second direction D2 thereof. The positive-polarity bus bar 14 and the negative-polarity bus bar 15 are connected to the capacitor 3 (capacitor elements 23 which will be described later) at both end parts thereof through the terminal parts 14T and 15T on both side in the second direction D2 thereof.

The plurality of output bus bars 16, 17, and 18 are disposed in the first direction D1 being in contact with the top surfaces of the upper-stage-side switching elements 11U for their corresponding phases and being in contact with the undersurfaces of the lower-stage-side switching elements 11L for their corresponding phases. In the present embodiment, the top surface of each upper-stage-side switching element 11U corresponds to a "second surface" of the upper-stage-side switching element 11U. In addition, the undersurface of each lower-stage-side switching element 11L corresponds to a "first surface" of the upper-stage-side switching element 11U.

Figure 6:
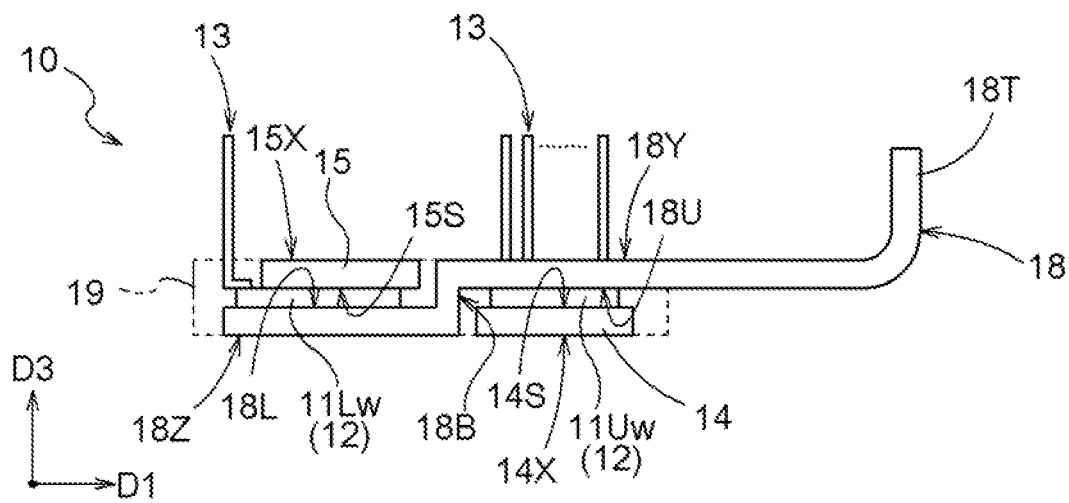
FIG. 6 is a side view of the inverter module.

As shown in FIG. 6, the third output bus bar 18 has a bent part 18B at a location between the lower-stage-side switching element 11Lw and the upper-stage-side switching element 11Uw for the W-phase in the first direction D1 which is an extending direction thereof. In addition, the third output bus bar 18 has a lower-stage output junction surface part 18L and an upper-stage output junction surface part 18U on both sides in the first direction D1 of the bent part 18B. The lower-stage output junction surface part 18L is a part serving as a contact with the undersurface (first surface) of the lower-stage-side switching element 11Lw for the W-phase, and the upper-stage output junction surface part 18U is a part serving as a contact with the top surface (second surface) of the upper-stage-side switching element 11Uw for the W-phase. The lower-stage output junction surface part 18L and the upper-stage output junction surface part 18U are parallel to each other, and the upper-stage output junction surface part 18U is disposed at a location offset upward relative to the lower-stage output junction surface part 18L. In this manner, the third output bus bar 18 is formed in a crank-like shape when viewed in the second direction D2. A step height of the bent part 18B is set to be equal to the sum of the thickness of the switching elements 11 and the thicknesses of the positive-polarity bus bar 14 (and the negative-polarity bus bar 15). In addition, the amount of offset between the upper-stage output junction surface part 18U and the lower-stage output junction surface part 18L is set to be equal to the thickness of the switching elements 11. Note that the thickness of the switching elements 11 includes junction layers (not shown) for joining the switching elements 11 and the bus bars (14, 15, and 18) together.

Furthermore, in the present embodiment, the upper-stage output junction surface part 18U of the third output bus bar 18 is disposed on the same plane as the negative-polarity junction surface part 15S of the negative-polarity bus bar 15. Furthermore, the lower-stage output junction surface part 18L of the third output bus bar 18 is disposed on the same plane as the positive-polarity junction surface part 14S of the positive-polarity bus bar 14.

Though depiction is omitted, the same also applies to the first output bus bar 16 and the second output bus bar 17. The first output bus bar 16 has a bent part 16B, a lower-stage output junction surface part 16L, and an upper-stage output junction surface part 16U, and is formed in a crank-like shape when viewed in the second direction D2. The upper-stage output junction surface part 16U of the first output bus bar 16 is disposed on the same plane as the negative-polarity junction surface part 15S of the negative-polarity bus bar 15, and the lower-stage output junction surface part 16L of the first output bus bar 16 is disposed on the same plane as the positive-polarity junction surface part 14S of the positive-polarity bus bar 14. The second output bus bar 17 has a bent part 17B, a lower-stage output junction surface part 17L, and an upper-stage output junction surface part 17U, and is formed in a crank-like shape when viewed in the second direction D2. The upper-stage output junction surface part 17U of the second output bus bar 17 is disposed on the same plane as the negative-polarity junction surface part 15S of the negative-polarity bus bar 15, and the lower-stage output junction surface part 17L of the second output bus bar 17 is disposed on the same plane as the positive-polarity junction surface part 14S of the positive-polarity bus bar 14.

In addition, the third output bus bar 18 has a lower-stage output opposite junction surface part 18Z and an upper-stage output opposite junction surface part 18Y on both sides in the first direction D1 of the bent part 18B. The lower-stage output opposite junction surface part 18Z is a part on the opposite side (undersurface side) in a thickness direction (third direction D3) of the lower-stage output junction surface part 18L at a portion of the third output bus bar 18 on a side that is in contact with the lower-stage-side switching element 11Lw. The upper-stage output opposite junction surface part 18Y is a part on the opposite side (top surface side) in the thickness direction (third direction D3) of the upper-stage output junction surface part 18U at a portion of the third output bus bar 18 on a side that is in contact with the upper-stage-side switching element 11Uw. The lower-stage output opposite junction surface part 18Z and the upper-stage output opposite junction surface part 18Y are parallel to each other, and the upper-stage output opposite junction surface part 18Y is disposed at a location offset upward relative to the lower-stage output opposite junction surface part 18Z.

The lower-stage output opposite junction surface part 18Z is disposed on the same plane as a positive-polarity opposite junction surface part 14X of the positive-polarity bus bar 14 that is on the opposite side (undersurface side) in the thickness direction (third direction D3) of the positive-polarity junction surface part 14S. In addition, the upper-stage output opposite junction surface part 18Y is disposed on the same plane as a negative-polarity opposite junction surface part 15X of the negative-polarity bus bar 15 that is on the opposite side (top surface side) in the thickness direction (third direction D3) of the negative-polarity junction surface part 15S.

Though depiction is omitted, the same also applies to the first output bus bar 16 and the second output bus bar 17. The first output bus bar 16 has the bent part 16B, a lower-stage output opposite junction surface part 16Z, and an upper-stage output opposite junction surface part 16Y. The lower-stage output opposite junction surface part 16Z of the first output bus bar 16 is disposed on the same plane as the positive-polarity opposite junction surface part 14X of the positive-polarity bus bar 14, and the upper-stage output opposite junction surface part 16Y of the first output bus bar 16 is disposed on the same plane as the negative-polarity opposite junction surface part 15X of the negative-polarity bus bar 15. The second output bus bar 17 has the bent part 17B, a lower-stage output opposite junction surface part 17Z, and an upper-stage output opposite junction surface part 17Y. The lower-stage output opposite junction surface part 17Z of the second output bus bar 17 is disposed on the same plane as the positive-polarity opposite junction surface part 14X of the positive-polarity bus bar 14, and the upper-stage output opposite junction surface part 17Y of the second output bus bar 17 is disposed on the same plane as the negative-polarity opposite junction surface part 15X of the negative-polarity bus bar 15.

In this manner, the plurality of switching elements 11, the positive-polarity bus bar 14, the negative-polarity bus bar 15, and the plurality of output bus bars 16, 17, and 18 are disposed, as shown in FIG. 6, such that they all fit within a range of the total thickness of the switching elements 11, the positive-polarity bus bar 14 (and the negative-polarity bus bar 15), and the third output bus bar 18 (and the output bus bars 16 and 17). Thus, miniaturization of the entire inverter module 10 is easily achieved. Furthermore, since the lower-stage output opposite junction surface part 18Z and the positive-polarity opposite junction surface part 14X are disposed on the same plane and the upper-stage output opposite junction surface part 18Y and the negative-polarity opposite junction surface part 15X are disposed on the same plane, by allowing at least any of them to serve as a cooling surface, a wide cooling area can be secured, enabling to improve cooling performance.

End parts of the plurality of output bus bars 16, 17, and 18 on the opposite side in the first direction D1 of the lower-stage output junction surface parts 16L, 17L, and 18L are bent upward, and these parts serve as terminal parts 16T, 17T, and 18T. The terminal parts 16T, 17T, and 18T are terminals to which are connected rotating electrical machine connecting bus bars 90 extending from the stator coils for the respective phases of the rotating electrical machine 5. In the present embodiment, the terminal parts 16T, 17T, and 18T are disposed on the opposite side in the first direction D1 of the upper-stage-side switching elements 11U from the lower-stage-side switching elements 11L. Accordingly, the terminal parts 16T, 17T, and 18T are disposed on the opposite side in the first direction D1 of the positive-polarity bus bar 14 from the negative-polarity bus bar 15.

As shown in FIGS. 4 to 6, sets of control terminals 13 of the lower-stage-side switching elements 11L are disposed at locations adjacent in the first direction D1 to the negative-polarity bus bar 15 at locations where the sets of control terminals 13 overlap the output bus bars 16, 17, and 18 connected to the lower-stage-side switching elements 11L, when viewed in the third direction. Note that the expression "overlap when viewed in a given direction" regarding disposition of two members indicates that when an imaginary straight line parallel to the line-of-sight direction is moved in each direction orthogonal to the imaginary straight line, at least a part of the two members has a region where the imaginary straight line intersects both of the two members.

The sets of control terminals 13 of the lower-stage-side switching elements 11L are disposed at locations adjacent to and on the opposite side in the first direction D1 of the negative-polarity bus bar 15 from the positive-polarity bus bar 14 and the terminal parts 16T, 17T, and 18T. The sets of control terminals 13 of the lower-stage-side switching elements 11L are disposed so as to extend upward in the third direction D3, with a predetermined spacing from a side surface of the negative-polarity bus bar 15. Furthermore, the sets of control terminals 13 of the lower-stage-side switching elements 11Lu, 11Lv, and 11Lw for the respective phases are disposed aligned side by side in a straight line in the second direction D2 as a whole.

On the other hand, the sets of control terminals 13 of the upper-stage-side switching elements 11U are disposed at locations adjacent in the second direction D2 to the output bus bars 16, 17, and 18 connected to the upper-stage-side switching elements 11U, at locations where the sets of control terminals 13 overlap the positive-polarity bus bar 14 when viewed in the third direction. At least one of the sets of control terminals 13 of the plurality of upper-stage-side switching elements 11U (in this example, two in total, one for the U-phase and one for the V-phase) is disposed between the first output bus bar 16 and the second output bus bar 17 which are adjacent to each other or between the second output bus bar 17 and the third output bus bar 18 which are adjacent to each other. The sets of control terminals 13 of the upper-stage-side switching elements 11U are disposed so as to extend upward in the third direction D3, with a predetermined spacing from side surfaces of the corresponding output bus bars 16, 17, and 18. Furthermore, the sets of control terminals 13 of the upper-stage-side switching elements 11Uu, 11Uv, and 11Uw for the respective phases are disposed parallel to each other, with each set of control terminals 13 aligned in the first direction D1.

Figure 7:
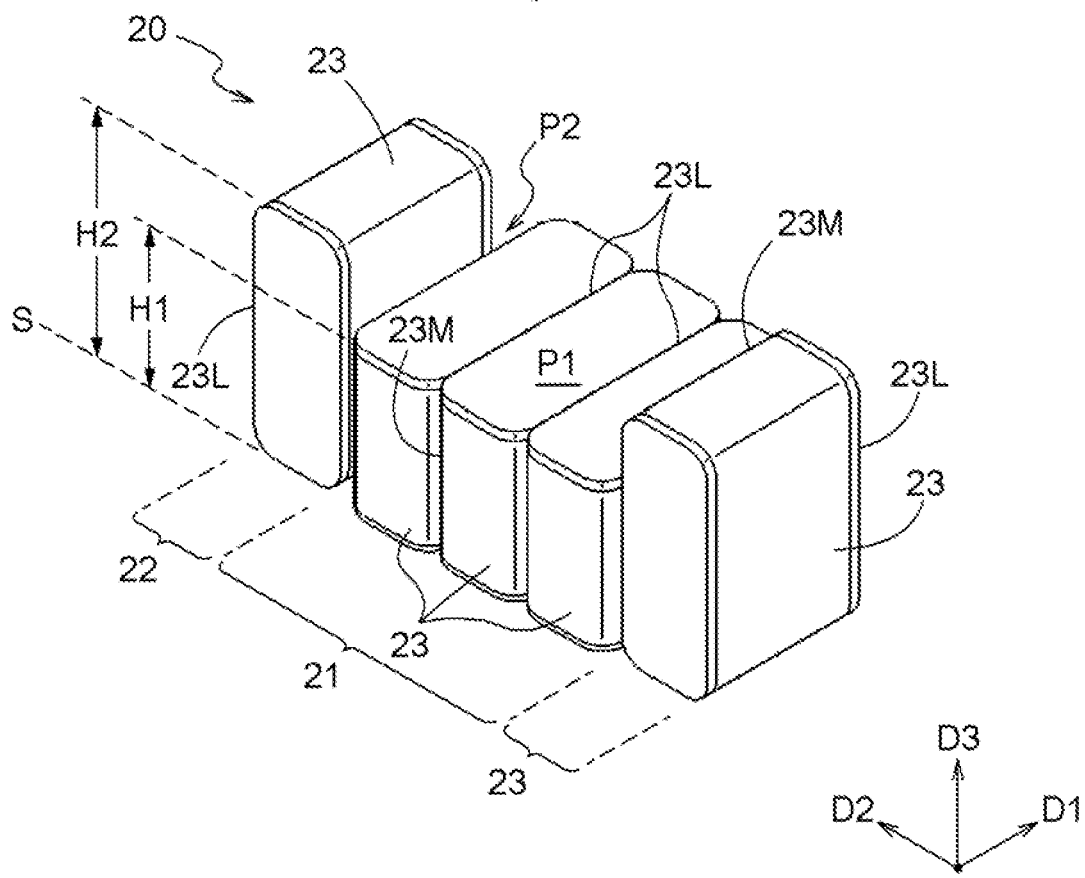
FIG. 7 is a perspective view of a capacitor module.

The capacitor module 20 is a module including a plurality of capacitor elements 23 included in the capacitor 3. As shown in FIG. 7, the capacitor module 20 has first portions 21 with a first height H1 and second portions 22 with a second height H2. The second height H2 is higher than the first height H1. Note that the first height H1 and the second height H2 are heights in the third direction D3 that start from a support surface S of a support plate 28 (see FIG. 14) which will be described later. In the present embodiment, the first portions 21 are provided so as to be put together at one location, whereas the second portions 22 are provided separately at two locations. The two second portions 22 are disposed on both sides in the second direction D2 of the first portions 21. In the present embodiment, the second direction D2 corresponds to an "arrangement direction" and the third direction D3 corresponds to a "height direction". In addition, the first direction D1 orthogonal to both the second direction D2 and the third direction D3 corresponds to a "width direction". Note that in the present embodiment the third direction D3 (height direction) is a direction orthogonal to the support surface S of the support plate 28, and it does not necessarily mean that the third direction D3 matches the vertical direction.

The plurality of capacitor elements 23 included in the capacitor module 20 each are formed in a rectangular parallelepiped shape. Each capacitor element 23 is formed in a rectangular parallelepiped shape that has longest sides 23L whose length along the sides is longest, shortest sides whose length along the sides is shortest, and middle sides 23M whose length along the sides is longer than the shortest sides and shorter than the longest sides 23L, and that has three sides extending from one vertex that have different lengths. The plurality of capacitor elements 23 are formed in the same shape. For the capacitor elements 23, for example, a capacitor (film capacitor) formed by rolling up a plastic film such as polyethylene terephthalate (PET) can be used. Note, however, that the configuration is not limited thereto, and multilayer capacitor elements 23 or capacitor elements 23 of other types may be used. The plurality of capacitor elements 23 are arranged supported by the support plate 28 (see FIG. 14).

In the present embodiment, the capacitor module 20 is configured to include five capacitor elements 23. All (five in this example) capacitor elements 23 are disposed in a posture in which the shortest sides thereof are placed in the second direction D2 which is the arrangement direction of the plurality of capacitor elements 23. The first portions 21 of the capacitor module 20 include some of the plurality of capacitor elements 23 (in this example, three capacitor elements 23) that are disposed in a first posture in which the longest sides 23L are placed in the first direction D1. The first height H1 of the first portions 21 of the capacitor module 20 is equal to the length of the middle sides 23M of the capacitor elements 23. In addition, the length (depth) in the first direction D1 of the first portions 21 of the capacitor module 20 is equal to the length of the longest sides 23L of the capacitor elements 23.

On the other hand, the second portions 22 of the capacitor module 20 include some of the plurality of capacitor elements 23 (in this example, each of the remaining two capacitor elements 23) that are disposed in a second posture in which the longest sides 23L are placed in the third direction D3. The second height H2 of the second portions 22 of the capacitor module 20 is equal to the length of the longest sides 23L of the capacitor elements 23. In addition, the length (depth) in the first direction D1 of the second portions 22 of the capacitor module 20 is equal to the length of the middle sides 23M of the capacitor elements 23.

By such a configuration, around the capacitor module 20 there are two types of spaces (a recessed space P1 and indented spaces P2) formed by the recesses and projections of the outside diameter of the capacitor module 20. The recessed space P1 is a space formed by a difference in height (a difference in length in the third direction D3) between the first portions 21 and the second portions 22. The recessed space P1 is formed as a space present in a higher position than the capacitor elements 23 in the first posture and sandwiched in the second direction D2 between the two capacitor elements 23 facing each other in the second posture. The indented spaces P2 each are a space formed by a difference in depth (a difference in length in the first direction D1) between a first portion 21 and a second portion 22. The indented spaces P2 each are formed as a space that is adjacent in the second direction D2 to a capacitor element 23 in the first posture and adjacent in the first direction D1 to a capacitor element 23 in the second posture, and that extends in the third direction D3 as a whole.

Figure 14:
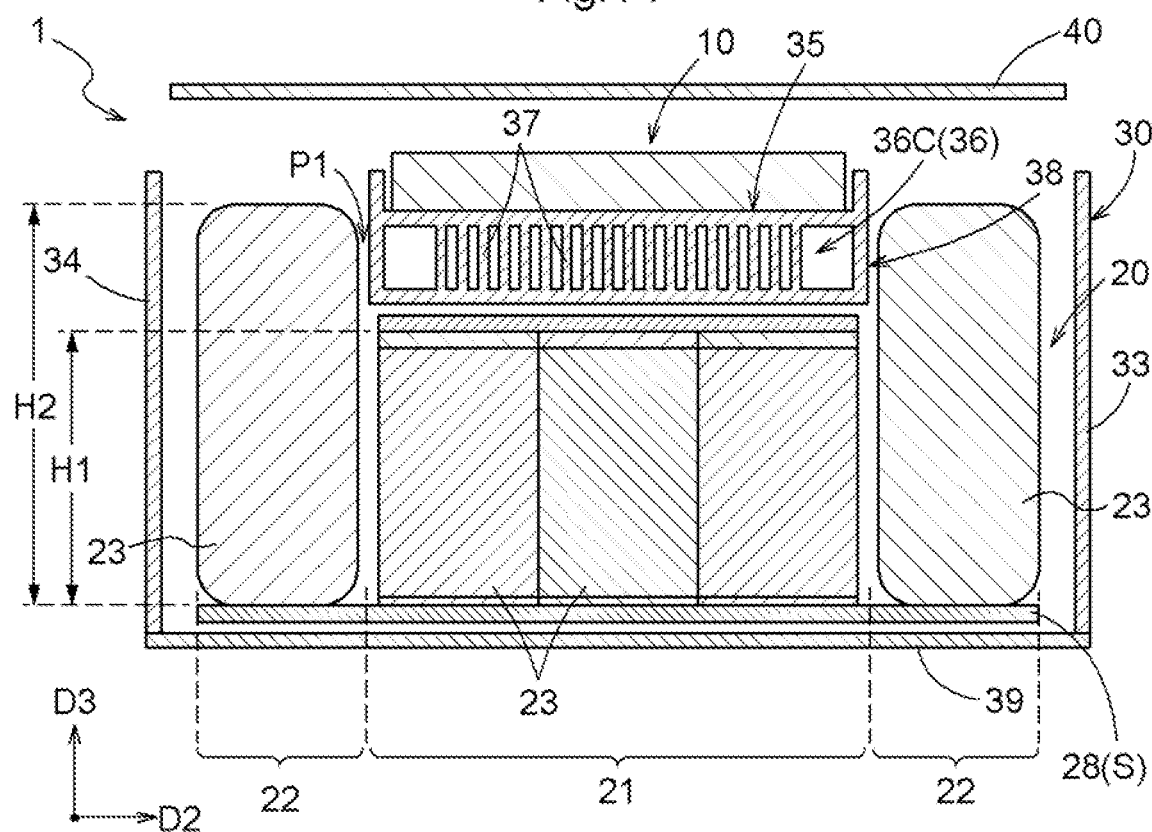
FIG. 14 is an XIV-XIV cross-sectional view of FIG. 8.

In the present embodiment, the inverter module 10 is disposed using the recessed space P1 among those spaces (see FIG. 14). Namely, the inverter module 10 is disposed in the recessed space P1 which is formed by a difference in height between the first portions 21 and the second portions 22 of the capacitor module 20. The inverter module 10 is disposed so as to overlap the second portions 22 (the capacitor elements 23 in the second posture) of the capacitor module 20 when viewed in the second direction, and overlap the first portions 21 (the capacitor elements 23 in the first posture) of the capacitor module 20 when viewed in the third direction. This matter will be described later also associated with a structure of the capacitor case 30.

Figure 11:
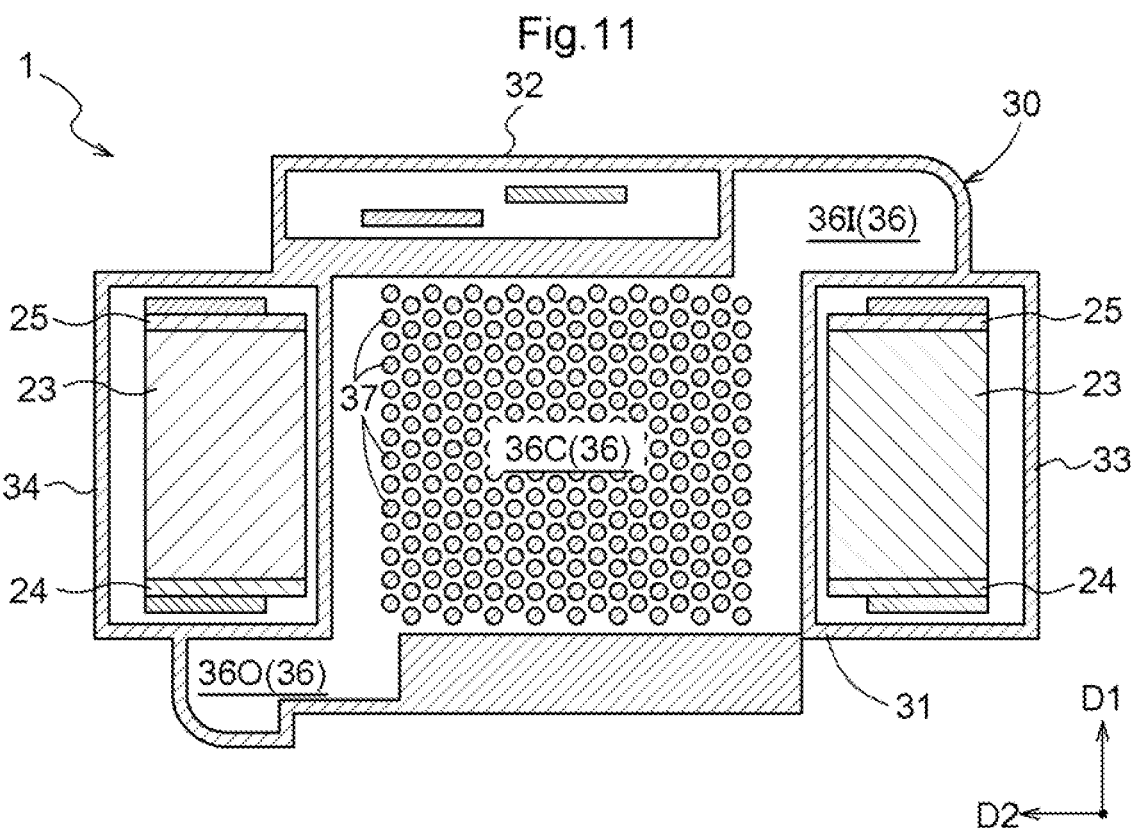
FIG. 11 is an XI-XI cross-sectional view of FIG. 9.
Figure 12:
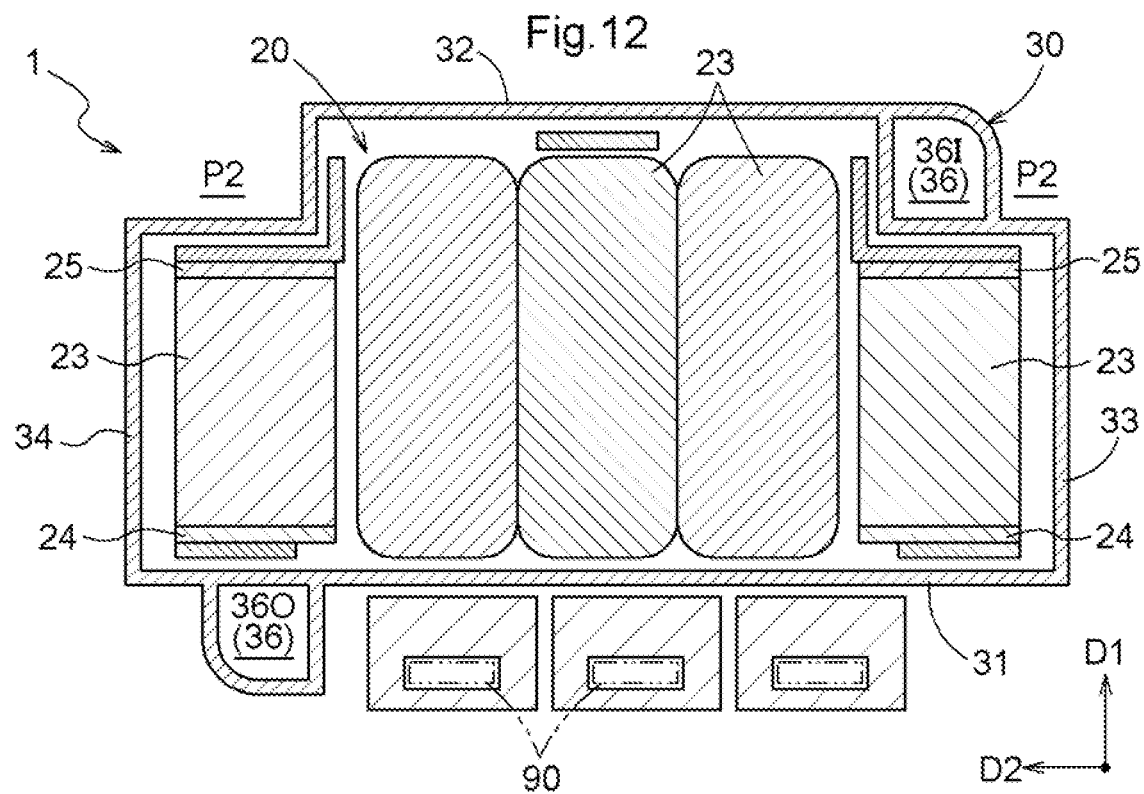
FIG. 12 is an XII-XII cross-sectional view of FIG. 9.

As shown in FIGS. 11 and 12, a positive electrode 24 and a negative electrode 25 are provided on side surfaces placed in the third direction D3 (both side surfaces in the first direction D1) of each second portion 22 (each capacitor element 23 in the second posture) of the capacitor module 20. The positive electrode 24 is provided on one of both side surfaces in the first direction D1 of the capacitor element 23 in the second posture, and the negative electrode 25 is provided on the other side surface. A positive-polarity terminal 26 of the capacitor module 20 is formed so as to be apart from the positive electrode 24 at a location in the second portion 22 where the positive-polarity terminal 26 does not overlap the first portions 21 (the capacitor elements 23 in the first posture) when viewed in the second direction. In addition, a negative-polarity terminal 27 of the capacitor module 20 is formed so as to be apart from the negative electrode 25 at a location in the second portion 22 where the negative-polarity terminal 27 does not overlap the first portions 21 when viewed in the second direction D2. In the present embodiment, the positive-polarity terminal 26 and the negative-polarity terminal 27 both are, as shown in FIG. 3, formed so as to be apart from the positive electrode 24 or the negative electrode 25 at an upper end part of the second portion 22 (an end part protruding from the first portions 21).

In each of the two second portions 22 of the capacitor module 20, the positive-polarity terminal 26 and the negative-polarity terminal 27 are disposed so as to be adjacent to each other in the first direction D1 at the same location in the second direction D2. The positive-polarity terminal parts 14T of the positive-polarity bus bar 14 of the inverter module 10 are connected to the positive-polarity terminals 26 of the capacitor module 20 through opening parts formed in a ceiling part 35 of the capacitor case 30. In addition, the negative-polarity terminal parts 15T of the negative-polarity bus bar 15 of the inverter module 10 are connected to the negative-polarity terminals 27 of the capacitor module 20 through the opening parts formed in the ceiling part 35 of the capacitor case 30.

The capacitor case 30 is a case that holds the capacitor module 20. As shown in FIGS. 3, 11 to 13, etc., the capacitor case 30 is formed in a box shape having a first sidewall 31, a second sidewall 32, a third sidewall 33, and a fourth sidewall 34 that enclose all sides of the capacitor module 20; and the ceiling part 35 that covers a top of the capacitor module 20. The capacitor case 30 of the present embodiment further includes coolant channels 36 that allow a coolant to pass therethrough. The coolant channels 36 are channels (cooling water channels) through which a coolant (e.g., cooling water) for cooling mainly the switching elements 11 included in the inverter module 10 flows, and are formed inside the capacitor case 30. The capacitor case 30 is formed of a material with high thermal conductivity (e.g., copper or aluminum). A heat sink 38 (see FIG. 14) is formed using a part of the capacitor case 30 where the coolant channels 36 are formed, enabling the capacitor case 30 to also function as a cooling device.

As shown in FIGS. 3 and 11, the coolant channels 36 include a flow-in channel 36I, a cooling channel 36C, and a discharge channel 36O. The flow-in channel 36I is formed on the second sidewall 32 so as to extend in the third direction D3. The discharge channel 36O is formed on the first sidewall 31 so as to extend in the third direction D3. The cooling channel 36C is formed on the ceiling part 35 so as to communicate with a downstream side of the flow-in channel 36I and communicate with an upstream side of the discharge channel 36O, and to be spread out planarly in both the first direction D1 and the second direction D2. As shown in FIGS. 11 and 14, a plurality of columnar (in the example shown in the drawings, long and thin cylindrical) fins 37 are provided in the cooling channel 36C. The plurality of fins 37 are provided in almost the entire area of the cooling channel 36C, and arranged regularly (in the example shown in the drawings, in a hexagonal lattice) with a slight clearance provided therebetween.

As described above, around the capacitor module 20 there are two types of spaces (the recessed space P1 and the indented spaces P2) formed by the recesses and projections of the outside diameter of the capacitor module 20. In the present embodiment, the coolant channels 36 are disposed using the recessed space P1 and the indented space P2. Namely, the coolant channels 36 are disposed in the recessed space P1 which is formed by a difference in height between the first portions 21 and the second portions 22 of the capacitor module 20, and in an indented space P2 which is formed by a difference in depth between a first portion 21 and a second portion 22 of the capacitor module 20.

Specifically, as shown in FIG. 12, in one of the two indented spaces P2, the flow-in channel 36I included in the coolant channels 36 is disposed along the indented space P2. The flow-in channel 36I is disposed so as to overlap a second portion 22 of the capacitor module 20 when viewed in the first direction, and overlap a second portion 22 of the capacitor module 20 when viewed in the second direction. In addition, as shown in FIG. 14, the cooling channel 36C included in the coolant channels 36 is disposed in the recessed space P1. The cooling channel 36C is disposed so as to overlap the second portions 22 of the capacitor module 20 when viewed in the second direction, and overlap the first portions 21 of the capacitor module 20 when viewed in the third direction. The cooling channel 36C is disposed between the first portions 21 of the capacitor module 20 and the inverter module 10 in the recessed space P1. A top surface of the cooling channel 36C (heat sink 38) is formed to be a flat surface, and the inverter module 10 is fixed to the top surface. The inverter module 10 is fixed to the top surface of the heat sink 38 with an insulating resin sheet (not shown), etc., provided therebetween.

As shown in FIGS. 2, 8 to 10, etc., mounting parts 31M are provided at lower end portions of boundary portions of the first sidewall 31 between the first sidewall 31 and each of the third sidewall 33 and the fourth sidewall 34, and mounting parts 32M are provided at lower end portions of boundary portions of the second sidewall 32 between the second sidewall 32 and each of the third sidewall 33 and the fourth sidewall 34. The mounting parts 31M and 32M are parts for mounting the capacitor module 20 being held in the capacitor case 30 on another member. When the inverter unit 1 is independently distributed, for example, a bottom cover 39 (see FIG. 14) fixed to a lower part of the capacitor case 30 is "another member". In addition, when the inverter unit 1 is mounted on a vehicle, a part of the vehicle may be "another member", and when in that case a part of the vehicle, the bottom cover 39, and the capacitor case 30 are further screwed together, the part of the vehicle and the bottom cover 39 may be "another member".

Figure 8:
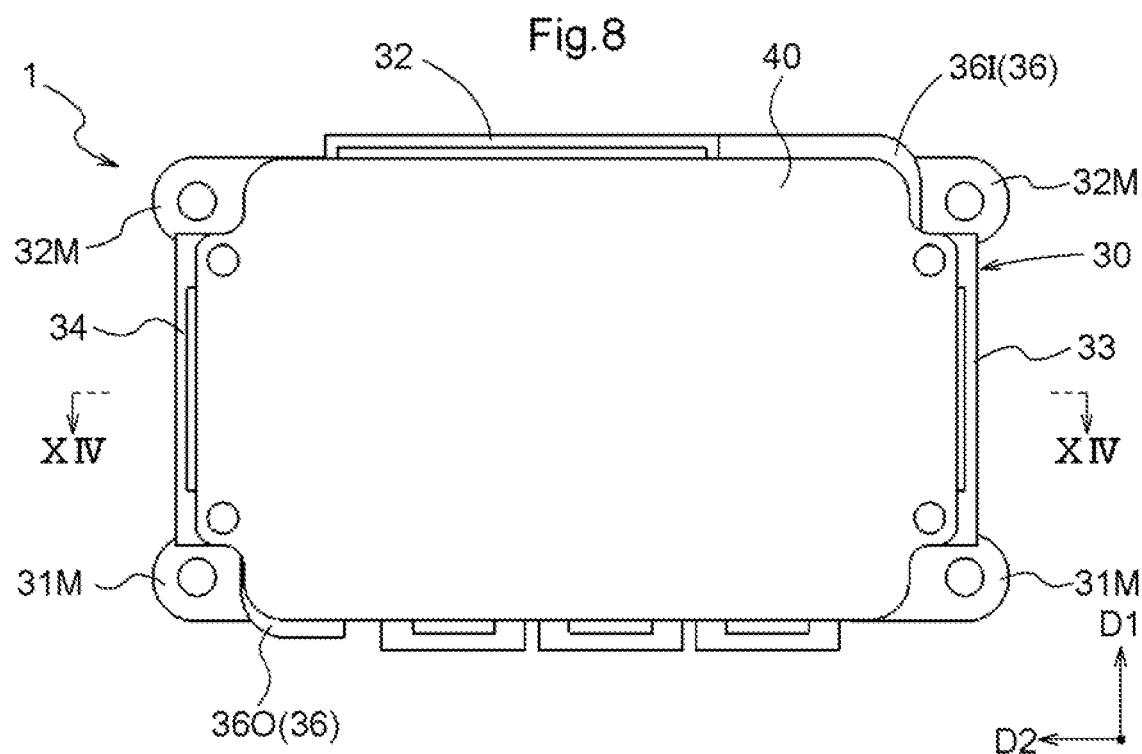
FIG. 8 is a plan view of the inverter unit.
Figure 9:
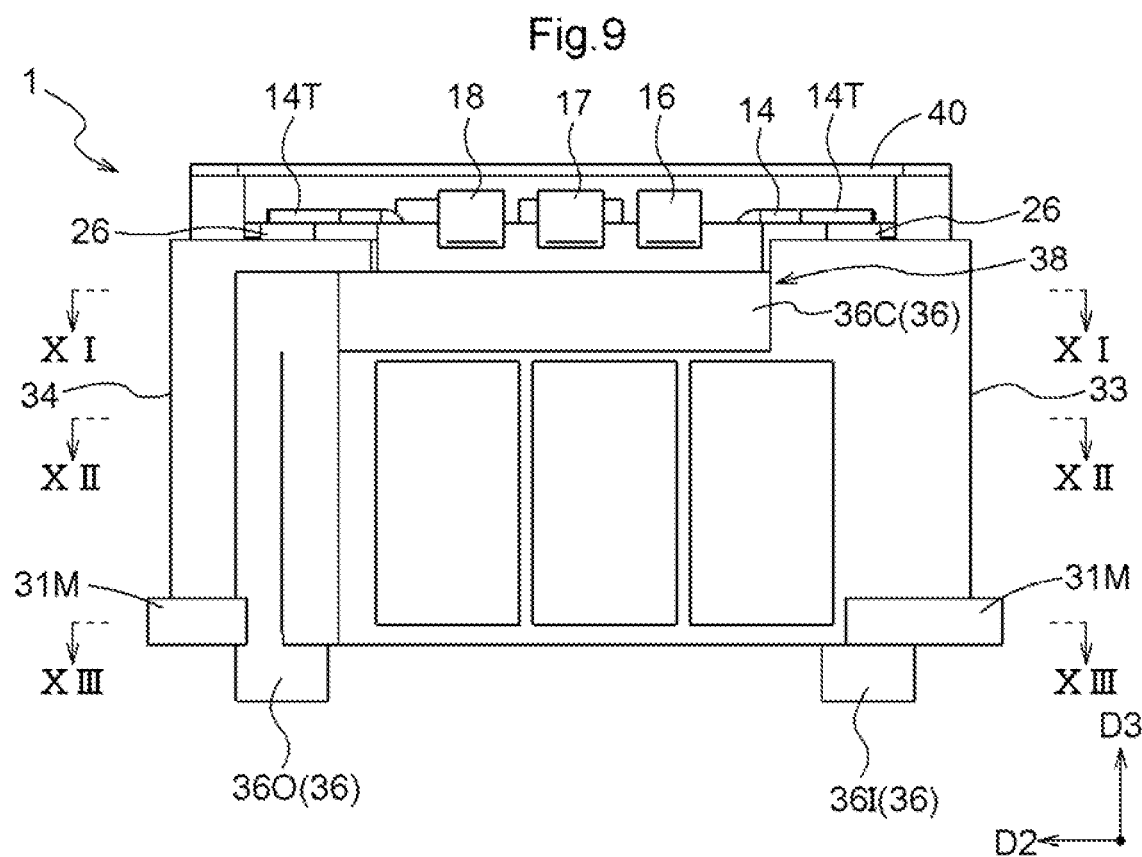
FIG. 9 is a front view of the inverter unit.
Figure 10:
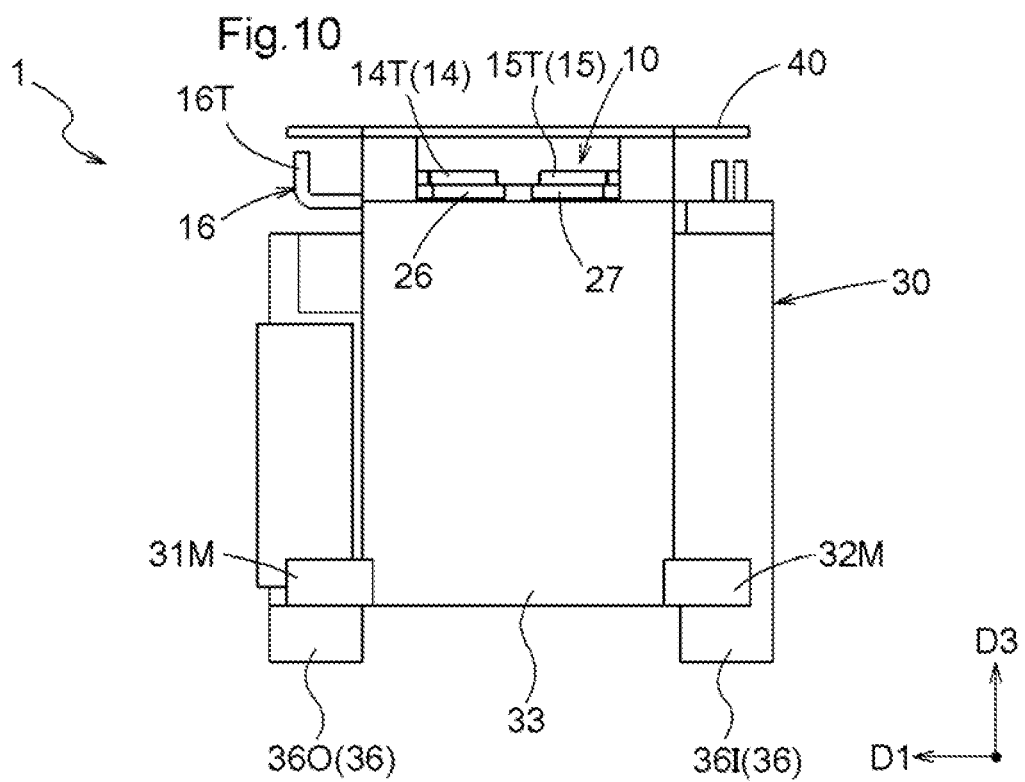
FIG. 10 is a side view of the inverter unit.
Figure 13:
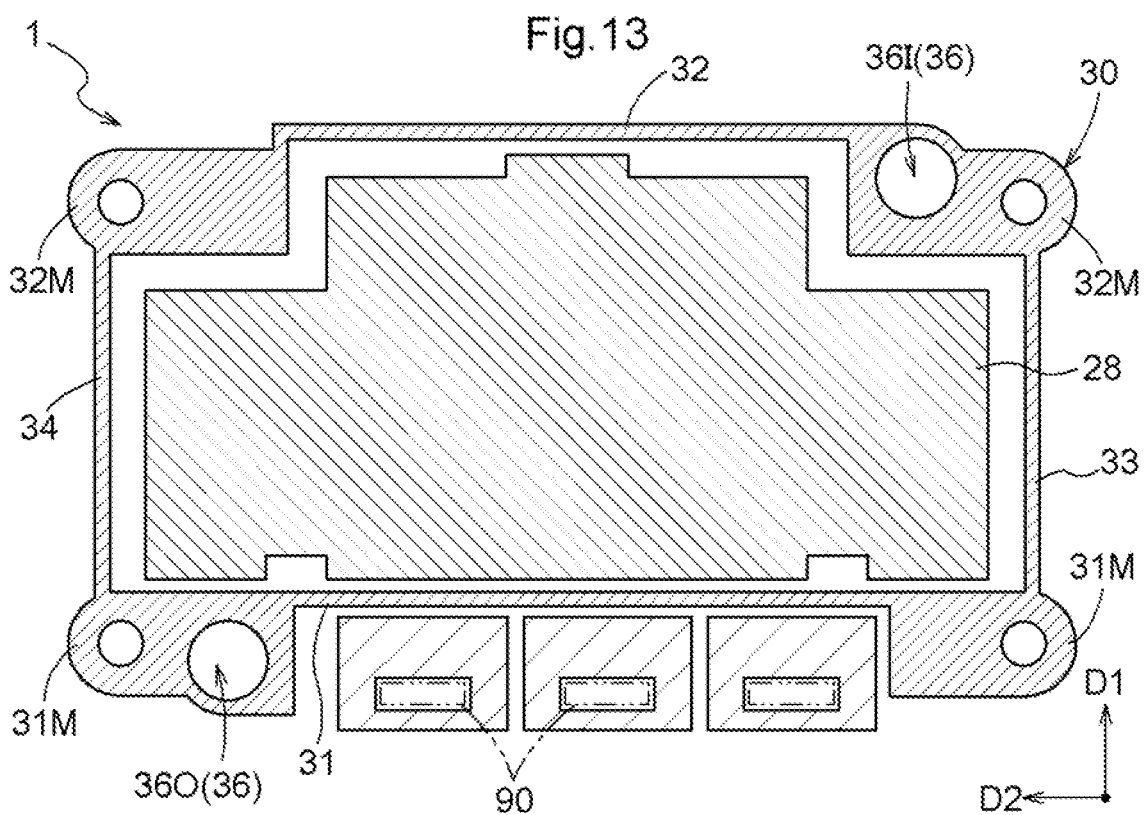
FIG. 13 is an XIII-XIII cross-sectional view of FIG. 9.

As can be understood with reference to FIGS. 8, 13, etc., the mounting parts 32M on the second sidewall 32 are disposed in the indented spaces P2 which are formed by a difference in depth between the first portions 21 and the second portions 22 of the capacitor module 20.

Note that as shown in FIGS. 12 and 13, the discharge channel 36O included in the coolant channels 36 and the mounting parts 31M on the first sidewall 31 are not disposed in the indented spaces P2. The discharge channel 36O and the mounting parts 31M are disposed so as to be adjacent to and on the outer side than a side surface of the capacitor module 20 that is disposed on the same plane on one side in the first direction D1 (the lower side in FIG. 12). At a location that overlaps the discharge channel 36O when viewed in the second direction, three rotating electrical machine connecting bus bars 90 extending from the stator coils for the respective phases of the rotating electrical machine 5 are disposed side by side in a row in the second direction D2 along the first sidewall 31.

The control board 40 is a board having mounted thereon functional parts included in the drive circuit 7 and the inverter control device 8. The control board 40 is fixed to the capacitor case 30, covering the inverter module 10 from above.

Second Embodiment

A second embodiment of an inverter module and an inverter unit will be described with reference to the drawings. In the present embodiment, specific structures of the positive-polarity bus bar 14, the negative-polarity bus bar 15, and the output bus bars 16 to 18 which are included in the inverter module 10 differ from those of the first embodiment. The inverter module 10 and the inverter unit 1 of the present embodiment will be described below mainly for differences from the first embodiment. Note that matters that are not particularly specified are the same as those of the first embodiment and thus are denoted by the same reference signs and a detailed description thereof is omitted.

Figure 15:
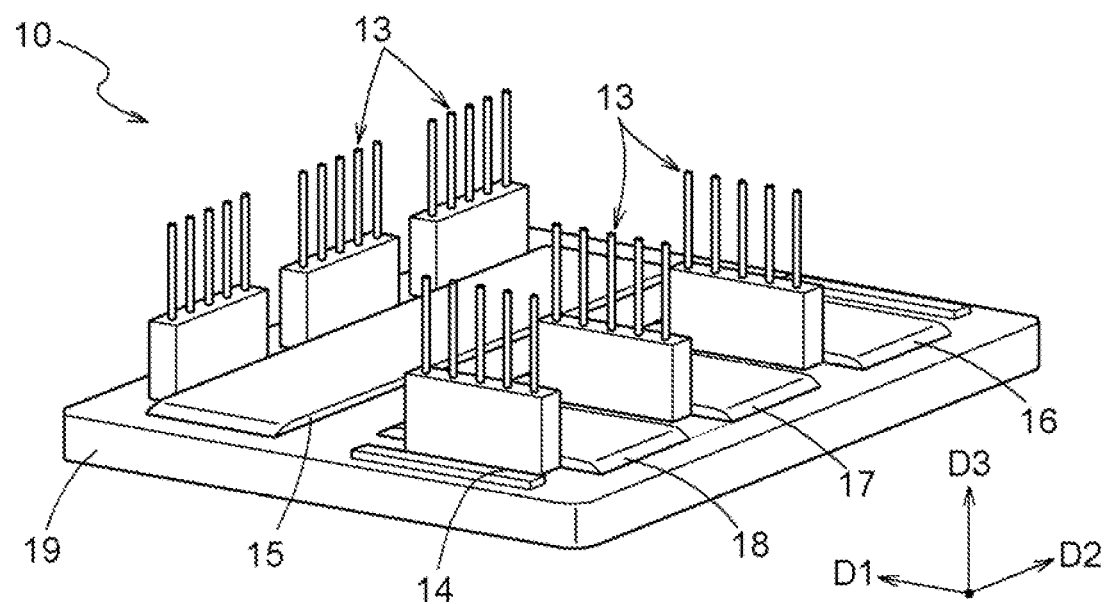
FIG. 15 is a perspective view of an inverter unit according to a second embodiment.

As shown in FIG. 15, in the inverter module 10 of the present embodiment, only the sets of control terminals 13 of the switching elements 11 significantly protrude from the main body part 19. The positive-polarity bus bar 14, the negative-polarity bus bar 15, and the output bus bars 16 to 18 each are mostly buried in the main body part 19 made of, for example, a mold resin.

Figure 16:
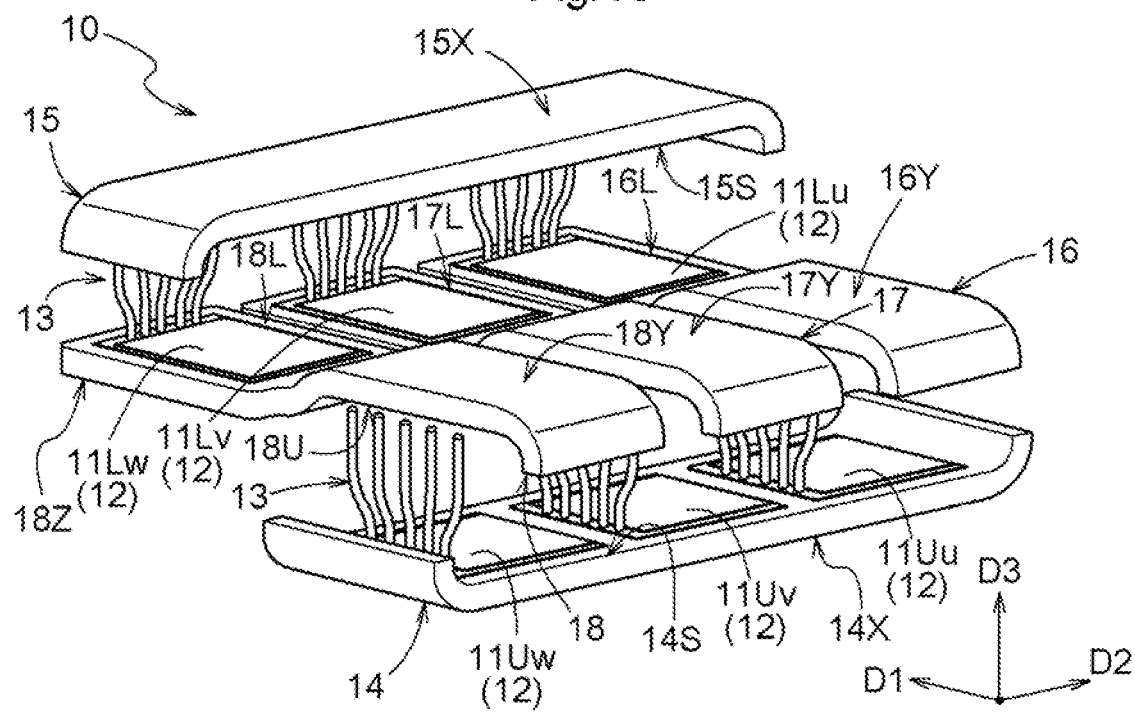
FIG. 16 is an exploded perspective view of the inverter unit.

FIG. 16 shows the states of the switching elements 11, the sets of control terminals 13, the positive-polarity bus bar 14, the negative-polarity bus bar 15, and the output bus bars 16 to 18 inside the main body part 19 in an exploded perspective manner. As shown in this drawing, both end parts (both end parts in the second direction D2) of the positive-polarity bus bar 14 which is disposed in the second direction D2 being in contact with the undersurfaces of the plurality of upper-stage-side switching elements 11U are bent upward. In addition, both end parts (both end parts in the second direction D2) of the negative-polarity bus bar 15 which is disposed in the second direction D2 being in contact with the top surfaces of the plurality of lower-stage-side switching elements 11L are bent downward. Furthermore, end parts of portions of the output bus bars 16, 17, and 18 for the respective phases on a side that are in contact with the upper-stage-side switching elements 11U are bent downward. The output bus bars 16, 17, and 18 are disposed in the first direction D1 being in contact with the undersurfaces of the lower-stage-side switching elements 11L and being in contact with the top surfaces of the upper-stage-side switching elements 11U.

Figure 17:
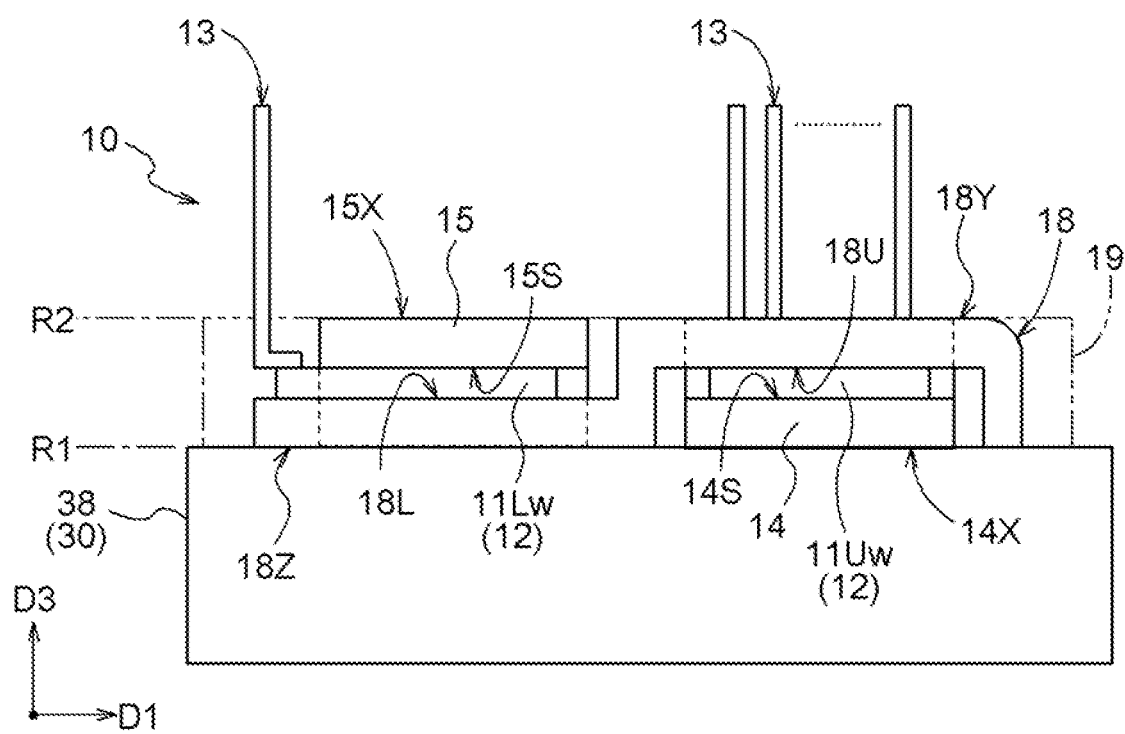
FIG. 17 is a side view of the inverter module.

The positive-polarity bus bar 14 has the positive-polarity junction surface parts 14S on a top surface thereof, and the undersurfaces (first surfaces) of the upper-stage-side switching elements 11U are joined to the positive-polarity junction surface parts 14S. As shown in FIG. 17, the positive-polarity opposite junction surface part 14X of the positive-polarity bus bar 14 which is on the opposite side (undersurface side) in the thickness direction (third direction D3) of the positive-polarity junction surface part 14S is disposed on a first reference plane R1. In the present embodiment, the first reference plane R1 is the top surface of the heat sink 38. In addition, the negative-polarity bus bar 15 has the negative-polarity junction surface parts 15S on an undersurface thereof, and the top surfaces (second surfaces) of the lower-stage-side switching elements 11L are joined to the negative-polarity junction surface parts 15S. The negative-polarity opposite junction surface part 15X of the negative-polarity bus bar 15 which is on the opposite side (top surface side) in the thickness direction (third direction D3) of the negative-polarity junction surface part 15S is disposed on a second reference plane R2 different than the first reference plane R1. In the present embodiment, the second reference plane R2 is an imaginary plane defined in a higher position than the first reference plane R1, and is defined as a plane parallel to the first reference plane R1.

In addition, the third output bus bar 18 has the lower-stage output junction surface part 18L on a top surface thereof and has the upper-stage output junction surface part 18U on an undersurface thereof, and the undersurface (first surface) of the lower-stage-side switching element 11Lw for the W-phase is joined to the lower-stage output junction surface part 18L, and the top surface (second surface) of the upper-stage-side switching element 11Uw for the W-phase is joined to the upper-stage output junction surface part 18U. The lower-stage output opposite junction surface part 18Z which is on the opposite side (undersurface side) in the thickness direction (third direction D3) of the lower-stage output junction surface part 18L at a portion of the third output bus bar 18 on a side that is in contact with the lower-stage-side switching element 11Lw is disposed on the first reference plane R1. The upper-stage output opposite junction surface part 18Y which is on the opposite side (top surface side) in the thickness direction (third direction D3) of the upper-stage output junction surface part 18U at a portion of the third output bus bar 18 on a side that is in contact with the upper-stage-side switching element 11Uw is disposed on the second reference plane R2.

In this manner, in the present embodiment, the lower-stage output opposite junction surface part 18Z of the third output bus bar 18 and the positive-polarity opposite junction surface part 14X of the positive-polarity bus bar 14 are disposed on the same plane. The lower-stage output opposite junction surface part 18Z and the positive-polarity opposite junction surface part 14X are disposed on the common first reference plane R1. Furthermore, the upper-stage output opposite junction surface part 18Y of the third output bus bar 18 and the negative-polarity opposite junction surface part 15X of the negative-polarity bus bar 15 are disposed on the same plane. The upper-stage output opposite junction surface part 18Y and the negative-polarity opposite junction surface part 15X are disposed on the common second reference plane R2. As such, a pair of the lower-stage output opposite junction surface part 18Z and the positive-polarity opposite junction surface part 14X, a pair of the lower-stage output junction surface part 18L and the positive-polarity junction surface part 14S, a pair of the upper-stage output junction surface part 18U and the negative-polarity junction surface part 15S, and a pair of the upper-stage output opposite junction surface part 18Y and the negative-polarity opposite junction surface part 15X each are disposed on their corresponding same plane.

The end parts on both sides in the second direction D2 of the negative-polarity bus bar 15 that are bent downward are disposed on the first reference plane R1. The both end parts of the negative-polarity bus bar 15 are disposed on the same plane as the lower-stage output opposite junction surface part 18Z of the third output bus bar 18 and disposed on the same plane as the positive-polarity opposite junction surface part 14X, too. In addition, the downward-bent end part of a portion of the third output bus bar 18 on a side that is in contact with the upper-stage-side switching element 11Uw is disposed on the first reference plane R1. The end part of the portion of the third output bus bar 18 on the side that is in contact with the upper-stage-side switching element 11Uw is disposed on the same plane as the positive-polarity opposite junction surface part 14X and the lower-stage output opposite junction surface part 18Z.

Though depiction is omitted, the same also applies to the first output bus bar 16 and the second output bus bar 17. Namely, the lower-stage output opposite junction surface part 16Z of the first output bus bar 16 and the positive-polarity opposite junction surface part 14X of the positive-polarity bus bar 14 are disposed on the same plane (on the common first reference plane R1). The upper-stage output opposite junction surface part 16Y of the first output bus bar 16 and the negative-polarity opposite junction surface part 15X of the negative-polarity bus bar 15 are disposed on the same plane (on the common second reference plane R2). The bent end part of a portion of the first output bus bar 16 on a side that is in contact with the upper-stage-side switching element 11Uu is disposed on the first reference plane R1 and disposed on the same plane as the positive-polarity opposite junction surface part 14X and the lower-stage output opposite junction surface part 16Z.

In addition, the lower-stage output opposite junction surface part 17Z of the second output bus bar 17 and the positive-polarity opposite junction surface part 14X of the positive-polarity bus bar 14 are disposed on the same plane (on the common first reference plane R1). The upper-stage output opposite junction surface part 17Y of the second output bus bar 17 and the negative-polarity opposite junction surface part 15X of the negative-polarity bus bar 15 are disposed on the same plane (on the common second reference plane R2). The bent end part of a portion of the second output bus bar 17 on a side that is in contact with the upper-stage-side switching element 11Uv is disposed on the first reference plane R1 and disposed on the same plane as the positive-polarity opposite junction surface part 14X and the lower-stage output opposite junction surface part 17Z.

In such a configuration, the negative-polarity bus bar 15 disposed in a higher position than the lower-stage-side switching elements 11L is in contact with the top surface of the heat sink 38 by the both bent end parts. Hence, even if the lower-stage-side switching elements 11L generate heat upon operation of the inverter circuit 4, the heat moves to a heat sink 38 side without kept in the negative-polarity bus bar 15. Thus, the negative-polarity bus bar 15 can be efficiently cooled. Portions of the output bus bars 16 to 18 for the respective phases on a side that are in contact with the lower-stage-side switching elements 11L are entirely in contact with the top surface of the heat sink 38, and thus, can also be efficiently cooled.

In addition, portions of the output bus bars 16 to 18 for the respective phases on a side that are in contact with the upper-stage-side switching elements 11U are also in contact with the top surface of the heat sink 38 by the bent end parts. Hence, even if the lower-stage-side switching elements 11L and the upper-stage-side switching elements 11U generate heat upon operation of the inverter circuit 4, the heat moves to the heat sink 38 side without kept in the output bus bars 16 to 18. Thus, the output bus bars 16 to 18 can be efficiently cooled. The positive-polarity bus bar 14 is entirely in contact with the top surface of the heat sink 38, and thus, can also be efficiently cooled.

In this manner, the upper-stage-side switching elements 11U joined between the positive-polarity bus bar 14 and the output bus bars 16 to 18 and the lower-stage-side switching elements 11L joined between the negative-polarity bus bar 15 and the output bus bars 16 to 18 can be efficiently cooled. Namely, all switching elements 11 can be efficiently cooled.

The upward-bent end parts on both sides in the second direction D2 of the positive-polarity bus bar 14 are disposed on the second reference plane R2. The both end parts of the positive-polarity bus bar 14 are disposed on the same plane (on the second reference plane R2) as the upper-stage output opposite junction surface part 18Y of the third output bus bar 18, and disposed on the same plane as the negative-polarity opposite junction surface part 15X, too. Though depiction is omitted, the same also applies to the first output bus bar 16 and the second output bus bar 17.

Such a configuration enables to achieve protection of the switching elements 11 upon manufacturing of the inverter unit 1, in association with the above-described configuration in which the both end parts of the negative-polarity bus bar 15 and the end parts of portions of the output bus bars 16 to 18 on a side that are in contact with the upper-stage-side switching elements 11U are in contact with the top surface of the heat sink 38. This matter will be described below. When the inverter module 10 is fixed to the top surface of the heat sink 38 of the capacitor case 30, the inverter module 10 may be pressed and crimped from above using a planar jig. In such a case, the first reference plane R1 serves as a support surface and the second reference plane R2 serves as a pressing plane, and by having the above-described configurations, each of the bent end parts of the positive-polarity bus bar 14, the negative-polarity bus bar 15, and the output bus bars 16 to 18 receives a pressing load. Thus, the pressing load is less likely to be applied to the switching elements 11, enabling to manufacture the inverter unit 1 while protecting the switching elements 11.

Figure 18:
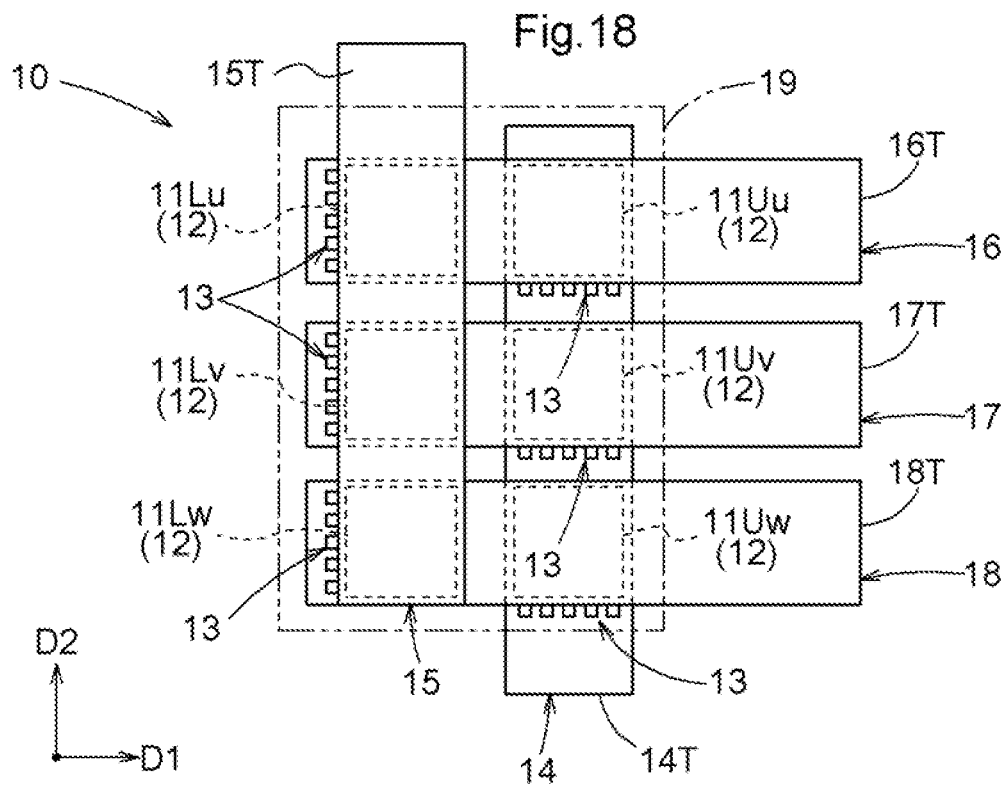
FIG. 18 is a plan view of an inverter module in another mode.

Other Embodiments (1) The above-described first embodiment describes, as an example, a configuration in which the positive-polarity bus bar 14 and the negative-polarity bus bar 15 have the terminal parts 14T and 15T, respectively, on both sides in the second direction D2 thereof. However, the configuration is not limited thereto, and for example, as shown in FIG. 18, the positive-polarity bus bar 14 and the negative-polarity bus bar 15 may have terminal parts 14T and 15T, respectively, on only one side in the second direction D2 thereof. In this case, as shown in the drawing, the positive-polarity terminal part 14T may be disposed on one side in the second direction D2, and the negative-polarity terminal part 15T may be disposed on the other side in the second direction D2. Alternatively, though depiction is omitted, the positive-polarity terminal part 14T and the negative-polarity terminal part 15T may be disposed on the same side in the second direction D2.

Figure 19:
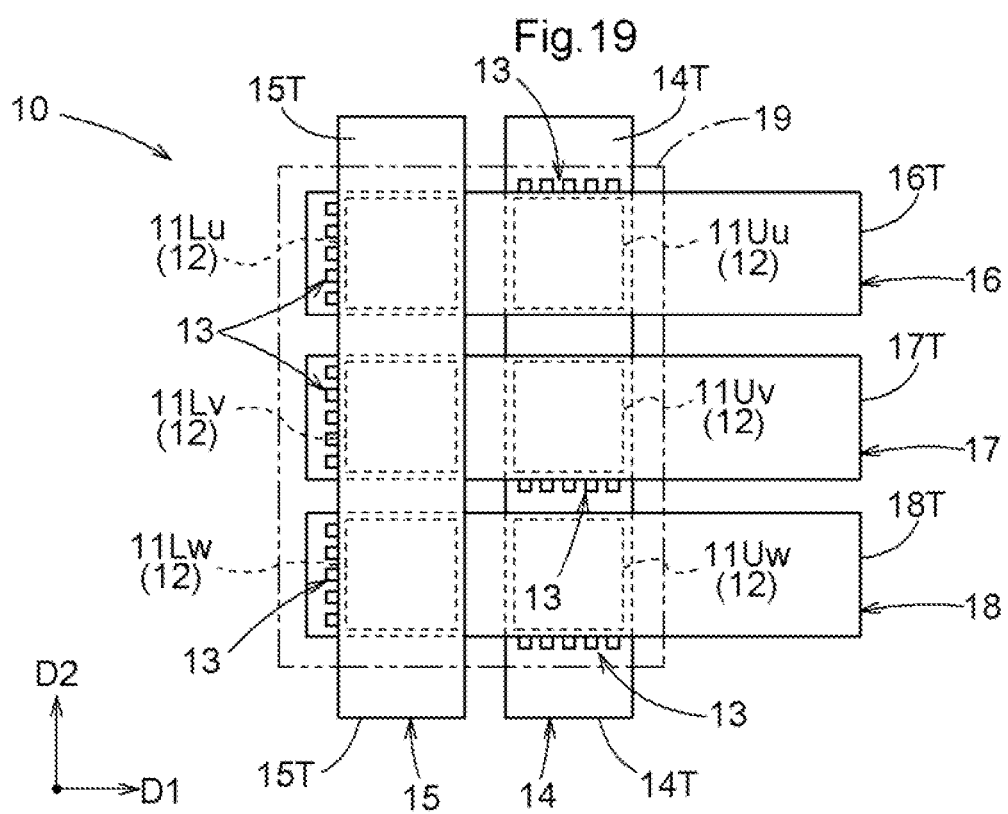
FIG. 19 is a plan view of an inverter module in another mode.

(2) Each of the above-described embodiments describes, as an example, a configuration in which the sets of control terminals 13 of the upper-stage-side switching elements 11U for the respective phases are disposed on the same side in the second direction D2 with respect to their corresponding output bus bars 16, 17, and 18. However, the configuration is not limited thereto, and for example, as shown in FIG. 19, one of the sets of control terminals 13 of the upper-stage-side switching elements 11U for the respective phases may be disposed on the opposite side in the second direction D2 of a corresponding one of the output bus bars 16, 17, and 18 from the other sets of control terminal 13.

Figure 20:
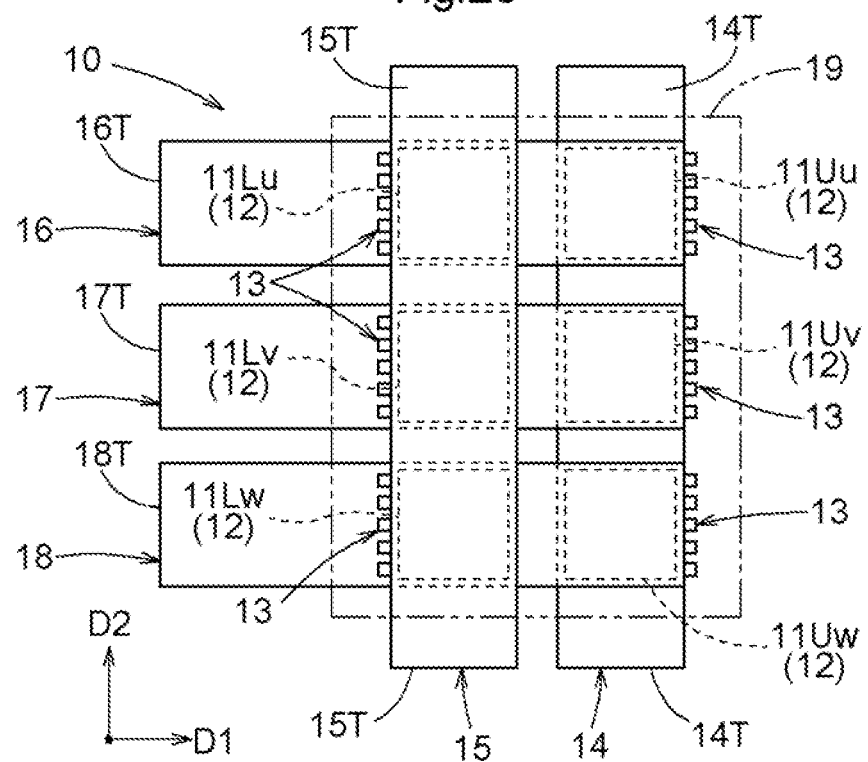
FIG. 20 is a plan view of an inverter module in another mode.
Figure 21:
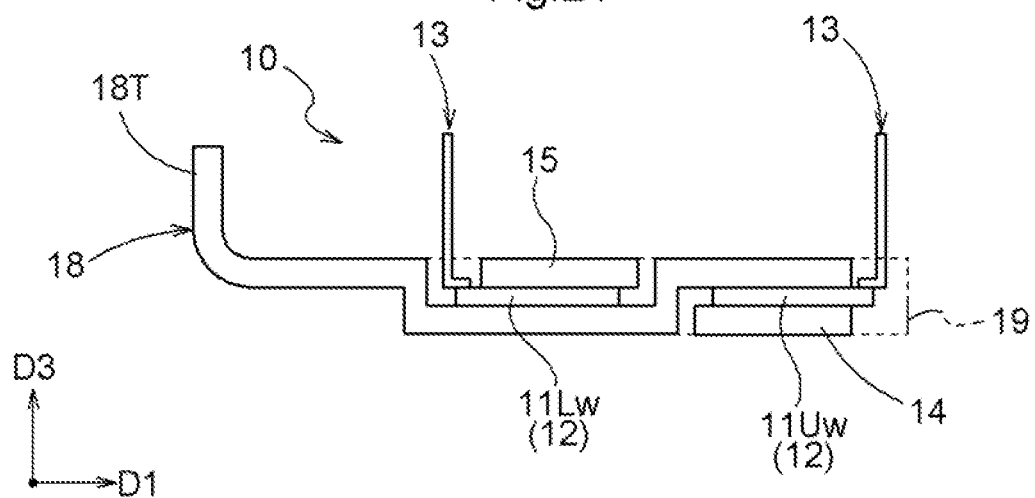
FIG. 21 is a side view of the inverter module in another mode.

(3) The above-described first embodiment describes, as an example, a configuration in which the upper-stage-side switching elements 11U are disposed at a location closer in the first direction D1 to the terminal parts 16T, 17T, and 18T of the output bus bars 16, 17, and 18 than the lower-stage-side switching elements 11L. However, the configuration is not limited thereto, and the lower-stage-side switching elements 11L may be disposed at a location closer to the terminal parts 16T, 17T, and 18T than the upper-stage-side switching elements 11U. In this case, for example, as shown in FIGS. 20 and 21, the sets of control terminals 13 of the upper-stage-side switching elements 11U and the sets of control terminals 13 of the lower-stage-side switching elements 11L are disposed at locations adjacent in the first direction D1 to the positive-polarity bus bar 14 or the negative-polarity bus bar 15. As shown in the drawings, the sets of control terminals 13 of the upper-stage-side switching elements 11U and the sets of control terminals 13 of the lower-stage-side switching elements 11L may be disposed parallel to each other, and opposite to each other in the first direction D1 with the positive-polarity bus bar 14 and the negative-polarity bus bar 15 sandwiched therebetween. Alternatively, the sets of control terminals 13 of the upper-stage-side switching elements 11U may be disposed at a location adjacent in the first direction D1 to the positive-polarity bus bar 14, and the sets of control terminals 13 of the lower-stage-side switching elements 11L may be disposed at a location adjacent in the second direction D2 to the output bus bars 16, 17, and 18 which are connected to the lower-stage-side switching elements 11L.

Figure 22:
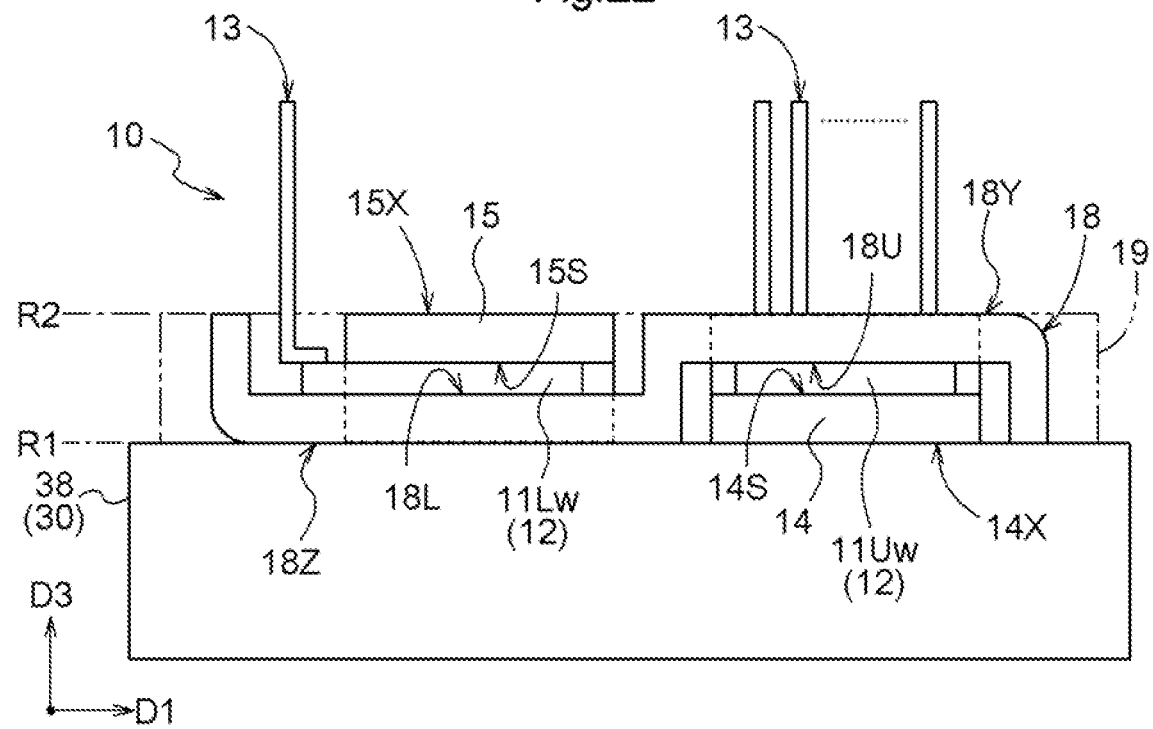
FIG. 22 is a side view of an inverter module in another mode.

(4) The above-described second embodiment describes, as an example, a configuration in which only the end parts of portions of the output bus bars 16 to 18 on a side that are in contact with the upper-stage-side switching elements 11U are bent. However, the configuration is not limited thereto, and for example, as shown in FIG. 22, both end parts in the first direction D1 of the output bus bars 16 to 18 that also include end parts of portions on a side that are in contact with the lower-stage-side switching elements 11L may be bent. In this case, it is preferred that the end parts of the portions of the output bus bars 16 to 18 on the side that are in contact with the lower-stage-side switching elements 11L be provided so as to be located on the second reference plane R2, and be disposed on the same plane as the negative-polarity opposite junction surface part 15X and the upper-stage output opposite junction surface part 18Y. By doing so, those bent end parts can also receive a pressing load occurring upon crimping and fixing, and thus, the switching elements 11 can be more securely protected.

Figure 23:
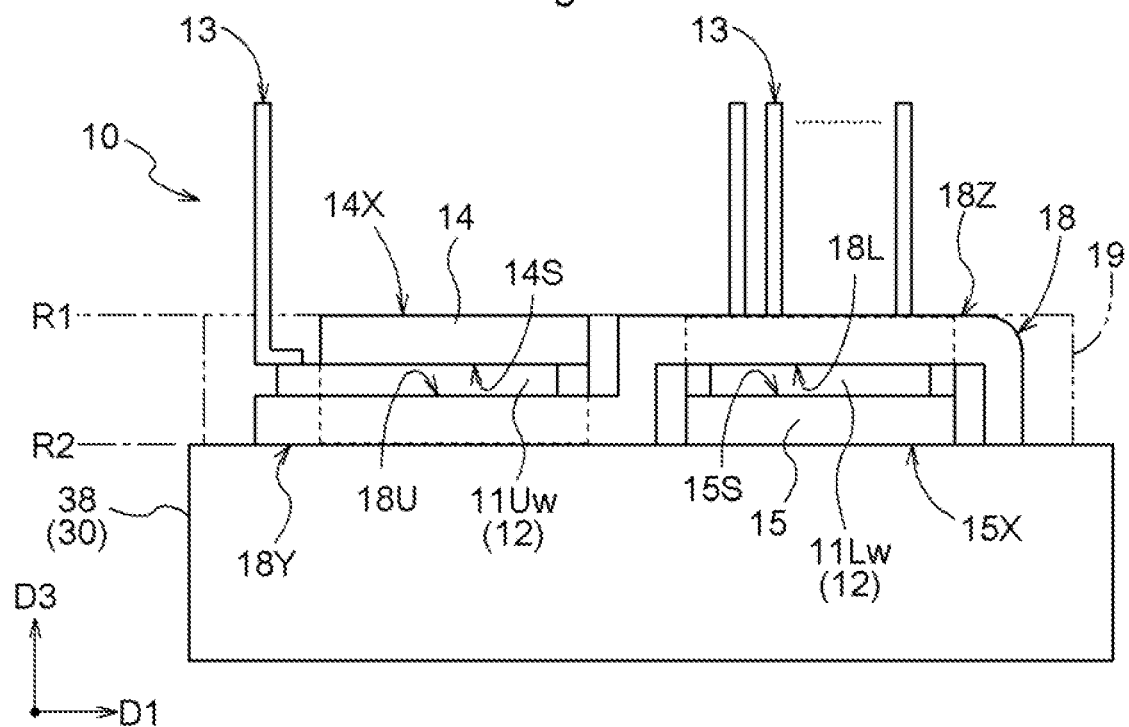
FIG. 23 is a side view of an inverter module in another mode.

(5) The above-described second embodiment describes, as an example, a configuration in which the first reference plane R1 is the top surface of the heat sink 38, and the second reference plane R2 is an imaginary plane defined in a higher position than the first reference plane R1. However, the configuration is not limited thereto, and for example, as shown in FIG. 23, the second reference plane R2 may be the top surface of the heat sink 38, and the first reference plane R1 may be an imaginary plane defined in a higher position than the second reference plane R2. Even in such a configuration, likewise, all switching elements 11 can be efficiently cooled, and the switching elements 11 can be protected upon crimping and fixing of the inverter module 10.

(6) Each of the above-described embodiments describes, as an example, a configuration in which the upper-stage-side switching elements 11U and the lower-stage-side switching elements 11L for the respective phases are disposed on the same plane. However, the configuration is not limited thereto, and for example, the upper-stage-side switching elements 11U and the lower-stage-side switching elements 11L for the respective phases may be disposed at different locations in the third direction D3 in a staggered manner. In this case, the output bus bars 16, 17, and 18 may be formed planarly when viewed in the second direction, without having the bent parts 16B, 17B, and 18B. In addition, in a configuration in which the upper-stage-side switching elements 11U and the lower-stage-side switching elements 11L for the respective phases are disposed on the same plane, by adjusting the shape of the sets of control terminals 13, the output bus bars 16, 17, and 18 may be formed planarly when viewed in the second direction.

(7) Each of the above-described embodiments describes, as an example, a configuration in which the switching elements 11 each are formed of a chip-type element including the diode 12. However, the configuration is not limited thereto, and for example, the switching elements 11 and the diodes 12 may be formed of different independent elements.

(8) Each of the above-described embodiments describes, as an example, a configuration in which the first direction D1 serving as the "width direction" and the second direction D2 serving as the "arrangement direction" are orthogonal to each other. However, the configuration is not limited thereto, and the first direction D1 and the second direction D2 may diagonally intersect each other.

(9) Each of the above-described embodiments describes, as an example, a configuration in which some of the capacitor elements 23 having the same shape are disposed in the first posture and the others are disposed in the second posture, by which the capacitor module 20 has the first portions 21 and the second portions 22 that have different heights. However, the configuration is not limited thereto, and the capacitor module 20 may be configured to have the first portions 21 and the second portions 22 by using, for example, capacitor elements 23 of two different sizes in which only the heights are different. As such, the depth lengths in the first direction D1 of the first portions 21 and the second portions 22 of the capacitor module 20 may be set to be equal to each other.

(10) Each of the above-described embodiments describes, as an example, a configuration in which one side in the first direction D1 of the capacitor module 20 is disposed on the same plane, and the other side in the first direction D1 is provided with two indented spaces P2. However, the configuration is not limited thereto, and for example, indented spaces P2 may be provided at four corners of the capacitor module 20 by disposing the capacitor elements 23 in the second posture at middle portions of the capacitor elements 23 in the first posture. In this case, the discharge channel 36O included in the coolant channels 36 and the mounting parts 31M on the first sidewall 31 are also disposed in the indented spaces P2.

(11) Each of the above-described embodiments describes, as an example, a configuration in which a positive-polarity terminal 26 and a negative-polarity terminal 27 of the capacitor module 20 are formed so as to be apart from a positive electrode 24 or a negative electrode 25 at an upper end part of a second portion 22. However, the configuration is not limited thereto, and it is desirable that the positive-polarity terminal 26 and the negative-polarity terminal 27 be apart from the positive electrode 24 and the negative electrode 25 of the capacitor module 20 at a location near the inverter module 10. For example, the positive-polarity terminal 26 and the negative-polarity terminal 27 may be formed so as to be apart from the positive electrode 24 or the negative electrode 25 at a location in the second portion 22 that is higher in position than the first portions 21 and lower in position than the upper end part of the second portion 22. In other words, the positive-polarity terminal 26 and the negative-polarity terminal 27 are formed so as to be apart from the positive electrode 24 or the negative electrode 25 at a location in the second portion 22 where the positive-polarity terminal 26 and the negative-polarity terminal 27 do not overlap the first portions 21 when viewed in the second direction (viewed in the arrangement direction). Alternatively, the positive-polarity terminal 26 and the negative-polarity terminal 27 may be formed so as to be apart from the positive electrode 24 or the negative electrode 25 at a location where the positive-polarity terminal 26 and the negative-polarity terminal 27 overlap the first portions 21 when viewed in the second direction (viewed in the arrangement direction).

(12) Each of the above-described embodiments describes, as an example, a configuration in which the coolant channels 36 are disposed in the recessed space P1 and the indented space P2, and the inverter module 10 together with the cooling channel 36C included in the coolant channels 36 is disposed in the recessed space P1. However, the configuration is not limited thereto, and for example, as long as at least the inverter module 10 is disposed in the recessed space P1, the coolant channels 36 do not necessarily need to be disposed in both the recessed space P1 and the indented space P2.

(13) Configurations disclosed in each of the above-described embodiments (including each of the above-described embodiments and other embodiments; the same applies hereinafter) can also be applied in combination with configurations disclosed in other embodiments as long as a contradiction does not arise. For other configurations, too, the embodiments disclosed in this specification are to be considered in all respects as merely illustrative, and modifications can be made as appropriate without departing from the true spirit and scope of the present disclosure.

SUMMARY OF THE EMBODIMENTS

Summarizing the above, an inverter module according to the present disclosure preferably has the following configurations.

In an inverter module (10) including a plurality of switching elements (11) included in an inverter circuit (4) for converting electric power between direct current and alternating current of a plurality of phases; a positive-polarity bus bar (14); a negative-polarity bus bar (15); and a plurality of output bus bars (16, 17, and 18) for the respective plurality of phases, the plurality of switching elements (11) include upper-stage-side switching elements (11U) and lower-stage-side switching elements (11L) for the respective plurality of phases, a corresponding one of the upper-stage-side switching elements (11U) and a corresponding one of the lower-stage-side switching elements (11L) for each phase are disposed side by side in a first direction (D1), the plurality of upper-stage-side switching elements (11U) are disposed side by side in a second direction (D2) intersecting the first direction (D1), and the plurality of lower-stage-side switching elements (11L) are disposed side by side in the second direction (D2), the positive-polarity bus bar (14) is disposed in the second direction (D2) being in contact with first surfaces of the plurality of upper-stage-side switching elements (11U), the negative-polarity bus bar (15) is disposed in the second direction (D2) being in contact with second surfaces of the plurality of lower-stage-side switching elements (11L), the second surfaces being on an opposite side of first surfaces of the plurality of lower-stage-side switching elements (11L), the output bus bars (16, 17, and 18) for the respective plurality of phases are disposed in the first direction (D1) being in contact with second surfaces of the upper-stage-side switching elements (11U) for corresponding phases, and being in contact with the first surfaces of the lower-stage-side switching elements (11L) for corresponding phases, the second surfaces being in an opposite side of the first surfaces of the upper-stage-side switching elements (11U), and upper-stage output opposite junction surface parts (16Y, 17Y, and 18Y) of the output bus bars (16, 17, and 18) for the respective plurality of phases and a negative-polarity opposite junction surface part (15X) of the negative-polarity bus bar (15) are disposed on a same plane, or lower-stage output opposite junction surface parts (16Z, 17Z, and 18Z) of the output bus bars (16, 17, and 18) for the respective plurality of phases and a positive-polarity opposite junction surface part (14X) of the positive-polarity bus bar (14) are disposed on a same plane, the upper-stage output opposite junction surface parts (16Y, 17Y, and 18Y) being on an opposite side of surfaces (16U, 17U, and 18U) of the output bus bars (16, 17, and 18) that are in contact in a thickness direction with the upper-stage-side switching elements (11U), the negative-polarity opposite junction surface part (15X) being on an opposite side of a surface (15S) of the negative-polarity bus bar (15) that is in contact in a thickness direction with the lower-stage-side switching elements (11L), the lower-stage output opposite junction surface parts (16Z, 17Z, and 18Z) being on an opposite side of surfaces (16L, 17L, and 18L) of the output bus bars (16, 17, and 18) that are in contact in a thickness direction with the lower-stage-side switching elements (11L), and the positive-polarity opposite junction surface part (14X) being on an opposite side of a surface (14S) of the positive-polarity bus bar (14) that is in contact in a thickness direction with the upper-stage-side switching elements (11U).

According to this configuration, the plurality of switching elements (11) are disposed aligned in "two columns×a number of columns corresponding to the number of phases". A single positive-polarity bus bar (14) is connected to the plurality of upper-stage-side switching elements (11U), a single negative-polarity bus bar (15) is connected to the plurality of lower-stage-side switching elements (11L), and the output bus bars (16, 17, and 18) are respectively connected to pairs of the upper-stage-side switching elements (11U) and the lower-stage-side switching elements (11L) for the respective phases. Since the plurality of switching elements (11), the positive-polarity bus bar (14), the negative-polarity bus bar (15), and the plurality of output bus bars (16, 17, and 18) are disposed so as to be put together in a cluster with a minimal number of components, it becomes easier to achieve miniaturization of the entire inverter module (10) and to improve the mountability of the inverter module (10). In addition, since the upper-stage output opposite junction surface parts (16Y, 17Y, and 18Y) and the negative-polarity opposite junction surface part (15X), or the lower-stage output opposite junction surface parts (16Z, 17Z, and 18Z) and the positive-polarity opposite junction surface part (14X) are disposed on the same plane, in terms of this point, too, miniaturization of the entire inverter module (10) is easily achieved.

In one aspect, it is preferred that the first direction (D1) and the second direction (D2) be orthogonal to each other.

According to this configuration, it becomes possible to dispose the positive-polarity bus bar (14), the negative-polarity bus bar (15), and the plurality of output bus bars (16, 17, and 18) in an orthogonal lattice as a whole. Hence, the entire inverter module (10) can be formed in a shape that is easily disposed in a rectangular disposition region, and it becomes easier to miniaturize a plan-view shape of the inverter module (10). Thus, it becomes easier to further improve the mountability of the inverter module (10).

In one aspect, it is preferred that the plurality of upper-stage-side switching elements (11U) be disposed on a same plane,
the plurality of lower-stage-side switching elements (11L) be disposed on a same plane,
a plurality of positive-polarity junction surface parts (14S) of the positive-polarity bus bar (14) be disposed on a same plane, the plurality of positive-polarity junction surface parts (14S) serving as contacts with the first surfaces of the respective plurality of upper-stage-side switching elements (11U), and
a plurality of negative-polarity junction surface parts (15S) of the negative-polarity bus bar (15) be disposed on a same plane, the plurality of negative-polarity junction surface parts (15S) serving as contacts with the second surfaces of the respective plurality of lower-stage-side switching elements (11L).

According to this configuration, the shapes of the positive-polarity bus bar (14) and the negative-polarity bus bar (15) are easily simplified. In addition, by this, the lengths of the positive-polarity bus bar (14) and the negative-polarity bus bar (15) are easily reduced and inductance is easily reduced.

In one aspect, it is preferred that
the upper-stage-side switching elements (11U) and the lower-stage-side switching elements (11L) for the respective plurality of phases be disposed on a same plane, and
upper-stage output junction surface parts (16U, 17U, and 18U) of the output bus bars (16, 17, and 18) for the respective plurality of phases be disposed on a same plane as the negative-polarity junction surface parts (15S), and lower-stage output junction surface parts (16L, 17L, and 18L) be disposed on a same plane as the positive-polarity junction surface parts (14S), the upper-stage output junction surface parts (16U, 17U, and 18U) serving as contacts with the second surfaces of the upper-stage-side switching elements (11U), and the lower-stage output junction surface parts (16L, 17L, and 18L) serving as contacts with the first surfaces of the lower-stage-side switching elements (11L).

According to this configuration, it becomes easier to planarly dispose the entire module. Hence, it becomes easier to achieve further miniaturization of the inverter module (10) and to further improve the mountability of the inverter module (10). In addition, for example, when a cooling device such as a heat sink is provided together, it becomes easier to widen a contact area between the cooling device and the inverter module (10). Thus, it becomes easier to efficiently cool the inverter module (10).

In one aspect, it is preferred that
the lower-stage output opposite junction surface parts (16Z, 17Z, and 18Z) and the positive-polarity opposite junction surface part (14X) be disposed on a common first reference plane (R1), and
end parts of the negative-polarity bus bar (15) be provided so as to be located on the first reference plane (R1).

According to this configuration, for example, when a cooling device is provided on the first reference plane (R1), not only the positive-polarity bus bar (14) and the plurality of output bus bars (16, 17, and 18), but also the end parts of the negative-polarity bus bar (15) can be brought into contact with the cooling device. Thus, the positive-polarity bus bar (14), the negative-polarity bus bar (15), and the plurality of output bus bars (16, 17, and 18) can be efficiently cooled, and the plurality of switching elements (11) can be efficiently cooled.

In one aspect,
it is preferred that an end part of a portion of each of the output bus bars (16, 17, and 18) for the respective plurality of phases be provided so as to be located on the first reference plane (R1), the portion being on a side provided with a corresponding one of the upper-stage output junction surface parts (16U, 17U, and 18U).

According to this configuration, not only the portions of the plurality of output bus bars (16, 17, and 18) that are in contact with the lower-stage-side switching elements (11L), but also the end parts of the portions of the plurality of output bus bars (16, 17, and 18) that are in contact with the upper-stage-side switching elements (11U) can be brought into contact with the cooling device. Thus, the plurality of output bus bars (16, 17, and 18) can be more efficiently cooled, and the plurality of switching elements (11) can be more efficiently cooled. In addition, in this configuration, for example, upon crimping and fixing the inverter module (10) to the cooling device, a pressing load can be received by the end parts of the negative-polarity bus bar (15) and the end parts of the plurality of output bus bars (16, 17, and 18). Thus, upon mounting the inverter module (10) on a higher-level device such as an inverter unit, a pressing load is less likely to be applied to the switching elements (11), enabling to achieve protection of the switching elements (11).

In one aspect, it is preferred that
the upper-stage output opposite junction surface parts (16Z, 17Z, and 18Z) and the negative-polarity opposite junction surface part (15X) be disposed on a common second reference plane (R2), and
end parts of the positive-polarity bus bar (14) be provided so as to be located on the second reference plane (R2).

According to this configuration, for example, when a cooling device is provided on the second reference plane (R2), not only the negative-polarity bus bar (15) and the plurality of output bus bars (16, 17, and 18), but also the end parts of the positive-polarity bus bar (14) can be brought into contact with the cooling device. Thus, the positive-polarity bus bar (14), the negative-polarity bus bar (15), and the plurality of output bus bars (16, 17, and 18) can be efficiently cooled, and the plurality of switching elements (11) can be efficiently cooled.

In one aspect,
it is preferred that an end part of a portion of each of the output bus bars (16, 17, and 18) for the respective plurality of phases be provided so as to be located on the second reference plane (R2), the portion being on a side provided with a corresponding one of the lower-stage output junction surface parts (16L, 17L, and 18L).

According to this configuration, not only the portions of the plurality of output bus bars (16, 17, and 18) that are in contact with the upper-stage-side switching elements (11U), but also the end parts of the portions of the plurality of output bus bars (16, 17, and 18) that are in contact with the lower-stage-side switching elements (11L) can be brought into contact with the cooling device. Thus, the plurality of output bus bars (16, 17, and 18) can be more efficiently cooled, and the plurality of switching elements (11) can be more efficiently cooled. In addition, in this configuration, for example, upon crimping and fixing the inverter module (10) to the cooling device, a pressing load can be received by the end parts of the positive-polarity bus bar (14) and the end parts of the plurality of output bus bars (16, 17, and 18). Thus, upon mounting the inverter module (10) on a higher-level device such as an inverter unit, a pressing load is less likely to be applied to the switching elements (11), enabling to achieve protection of the switching elements (11).

In one aspect,
it is preferred that each of the upper-stage-side switching elements (11U) and the lower-stage-side switching elements (11L) be a chip-type element including a diode (12) for rectification.

Such a chip-type element often has an outer shape close to a square. Hence, when the plurality of upper-stage-side switching elements (11U) and the lower-stage-side switching elements (11L) are disposed in the above-described manner, it becomes easier to efficiently dispose the plurality of upper-stage-side switching elements (11U) and the lower-stage-side switching elements (11L). Thus, it becomes easier to achieve miniaturization of the entire inverter module (10) and to improve the mountability of the inverter module (10).

In one aspect, it is preferred that
sets of control terminals (13) of either one of the upper-stage-side switching elements (11U) and the lower-stage-side switching elements (11L) be disposed at locations adjacent in the first direction (D1) to one of the positive-polarity bus bar (14) and the negative-polarity bus bar (15) with which the switching elements (11) are in contact, and
sets of control terminals (13) of another one of the upper-stage-side switching elements (11U) and the lower-stage-side switching elements (11L) be disposed at locations adjacent in the second direction (D2) to the output bus bars (16, 17, and 18) with which the switching elements (11) are in contact.

Alternatively, in one aspect,
it is preferred that each set of control terminals (13) of the upper-stage-side switching elements (11U) and the lower-stage-side switching elements (11L) be disposed at a location adjacent in the first direction (D1) to one of the positive-polarity bus bar (14) and the negative-polarity bus bar (15) with which the switching element (11) is in contact.

According to these configurations, in a configuration in which the plurality of output bus bars (16, 17, and 18) are disposed in the first direction (D1) and the positive-polarity bus bar (14) and the negative-polarity bus bar (15) are disposed in the second direction (D2), the sets of control terminals (13) of the respective switching elements (11) can be disposed in a compact manner while avoiding each bus bar. Thus, the entire inverter module (10) can be miniaturized.

In one aspect,
it is preferred that the positive-polarity bus bar (14) and the negative-polarity bus bar (15) be connected to a capacitor (3) at both end parts of the positive-polarity bus bar (14) and the negative-polarity bus bar (15).

According to this configuration, compared to a configuration in which the positive-polarity bus bar (14) and the negative-polarity bus bar (15) are connected to the capacitor (3) at only one end part thereof, the effective wiring length between each of the plurality of switching elements (11) and the capacitor (3) can be reduced, enabling to reduce inductance. Thus, it becomes possible to suppress switching loss to a small level.

The inverter module according to the present disclosure provides at least one of the above-described advantageous effects.

The invention claimed is:

1. An inverter module comprising: a plurality of switching elements included in an inverter circuit for converting electric power between direct current and alternating current of a plurality of phases; a positive-polarity bus bar; a negative-polarity bus bar; and a plurality of output bus bars for the respective plurality of phases,
wherein
the plurality of switching elements include upper-stage-side switching elements and lower-stage-side switching elements for the respective plurality of phases,
a corresponding one of the upper-stage-side switching elements and a corresponding one of the lower-stageside switching elements for each phase are disposed side by side in a first direction, the plurality of upper-stage-side switching elements are disposed side by side in a second direction intersecting the first direction, and the plurality of lower-stage-side switching elements are disposed side by side in the second direction, the positive-polarity bus bar is disposed in the second direction being in contact with first surfaces of the plurality of upper-stage-side switching elements, the negative-polarity bus bar is disposed in the second direction being in contact with second surfaces of the plurality of lower-stage-side switching elements, the second surfaces being on an opposite side of first surfaces of the plurality of lower-stage-side switching elements, the output bus bars for the respective plurality of phases are disposed in the first direction being in contact with second surfaces of the upper-stage-side switching elements for corresponding phases, and being in contact with the first surfaces of the lower-stage-side switching elements for corresponding phases, the second surfaces being in an opposite side of the first surfaces of the upper-stage-side switching elements, and upper-stage output opposite junction surface parts of the output bus bars for the respective plurality of phases and a negative-polarity opposite junction surface part of the negative-polarity bus bar are disposed on a same plane, or lower-stage output opposite junction surface parts of the output bus bars for the respective plurality of phases and a positive-polarity opposite junction surface part of the positive-polarity bus bar are disposed on a same plane, the upper-stage output opposite junction surface parts being on an opposite side of surfaces of the output bus bars that are in contact in a thickness direction with the upper-stage-side switching elements, the negative-polarity opposite junction surface part being on an opposite side of a surface of the negative-polarity bus bar that is in contact in a thickness direction with the lower-stage-side switching elements, the lower-stage output opposite junction surface parts being on an opposite side of surfaces of the output bus bars that are in contact in a thickness direction with the lower-stage-side switching elements, and the positive-polarity opposite junction surface part being on an opposite side of a surface of the positive-polarity bus bar that is in contact in a thickness direction with the upper-stage-side switching elements.

2. The inverter module according to claim 1, wherein the first direction and the second direction are orthogonal to each other.

3. The inverter module according to claim 1 or 2, wherein
the plurality of upper-stage-side switching elements are disposed on a same plane,
the plurality of lower-stage-side switching elements are disposed on a same plane,
a plurality of positive-polarity junction surface parts of the positive-polarity bus bar are disposed on a same plane, the plurality of positive-polarity junction surface parts serving as contacts with the first surfaces of the respective plurality of upper-stage-side switching elements, and
a plurality of negative-polarity junction surface parts of the negative-polarity bus bar are disposed on a same plane, the plurality of negative-polarity junction surface parts serving as contacts with the second surfaces of the respective plurality of lower-stage-side switching elements.

4. The inverter module according to claim 3, wherein
the upper-stage-side switching elements and the lower-stage-side switching elements for the respective plurality of phases are disposed on a same plane, and
upper-stage output junction surface parts of the output bus bars for the respective plurality of phases are disposed on a same plane as the negative-polarity junction surface parts, and lower-stage output junction surface parts are disposed on a same plane as the positive-polarity junction surface parts, the upper-stage output junction surface parts serving as contacts with the second surfaces of the upper-stage-side switching elements, and the lower-stage output junction surface parts serving as contacts with the first surfaces of the lower-stage-side switching elements.

5. The inverter module according to claim 4, wherein
the lower-stage output opposite junction surface parts and the positive-polarity opposite junction surface part are disposed on a common first reference plane, and
end parts of the negative-polarity bus bar are provided so as to be located on the first reference plane.

6. The inverter module according to claim 5, wherein an end part of a portion of each of the output bus bars for the respective plurality of phases is provided so as to be located on the first reference plane, the portion being on a side provided with a corresponding one of the upper-stage output junction surface parts.

7. The inverter module according to claim 6, wherein
the upper-stage output opposite junction surface parts and the negative-polarity opposite junction surface part are disposed on a common second reference plane, and
end parts of the positive-polarity bus bar are provided so as to be located on the second reference plane.

8. The inverter module according to claim 7, wherein an end part of a portion of each of the output bus bars for the respective plurality of phases is provided so as to be located on the second reference plane, the portion being on a side provided with a corresponding one of the lower-stage output junction surface parts.

9. The inverter module according to claim 8, wherein each of the upper-stage-side switching elements and the lower-stage-side switching elements is a chip-type element including a diode for rectification.

10. The inverter module according to claim 9, wherein
sets of control terminals of either one of the upper-stage-side switching elements and the lower-stage-side switching elements are disposed at locations adjacent in the first direction to one of the positive-polarity bus bar and the negative-polarity bus bar with which the switching elements are in contact, and
sets of control terminals of another one of the upper-stage-side switching elements and the lower-stage-side switching elements are disposed at locations adjacent in the second direction to the output bus bars with which the switching elements are in contact.

11. The inverter module according to claim 10, wherein each set of control terminals of the upper-stage-side switching elements and the lower-stage-side switching elements is disposed at a location adjacent in the first direction to one of the positive-polarity bus bar and the negative-polarity bus bar with which the switching element is in contact.

12. The inverter module according to claim 11, wherein the positive-polarity bus bar and the negative-polarity bus bar are connected to a capacitor at both end parts of the positive-polarity bus bar and the negative-polarity bus bar.

13. The inverter module according to claim 1, wherein
the plurality of upper-stage-side switching elements are disposed on a same plane,
the plurality of lower-stage-side switching elements are disposed on a same plane,
a plurality of positive-polarity junction surface parts of the positive-polarity bus bar are disposed on a same plane, the plurality of positive-polarity junction surface parts serving as contacts with the first surfaces of the respective plurality of upper-stage-side switching elements, and
a plurality of negative-polarity junction surface parts of the negative-polarity bus bar are disposed on a same plane, the plurality of negative-polarity junction surface parts serving as contacts with the second surfaces of the respective plurality of lower-stage-side switching elements.

14. The inverter module according to claim 1, wherein
the lower-stage output opposite junction surface parts and the positive-polarity opposite junction surface part are disposed on a common first reference plane, and
end parts of the negative-polarity bus bar are provided so as to be located on the first reference plane.

15. The inverter module according to claim 1, wherein
the upper-stage output opposite junction surface parts and the negative-polarity opposite junction surface part are disposed on a common second reference plane, and
end parts of the positive-polarity bus bar are provided so as to be located on the second reference plane.

16. The inverter module according to claim 1, wherein each of the upper-stage-side switching elements and the lower-stage-side switching elements is a chip-type element including a diode for rectification.

17. The inverter module according to claim 1, wherein
sets of control terminals of either one of the upper-stage-side switching elements and the lower-stage-side switching elements are disposed at locations adjacent in the first direction to one of the positive-polarity bus bar and the negative-polarity bus bar with which the switching elements are in contact, and
sets of control terminals of another one of the upper-stage-side switching elements and the lower-stage-side switching elements are disposed at locations adjacent in the second direction to the output bus bars with which the switching elements are in contact.

18. The inverter module according to claim 1, wherein each set of control terminals of the upper-stage-side switching elements and the lower-stage-side switching elements is disposed at a location adjacent in the first direction to one of the positive-polarity bus bar and the negative-polarity bus bar with which the switching element is in contact.

19. The inverter module according to claim 1, wherein the positive-polarity bus bar and the negative-polarity bus bar are connected to a capacitor at both end parts of the positive-polarity bus bar and the negative-polarity bus bar.

20. The inverter module according to claim 2, wherein
the lower-stage output opposite junction surface parts and the positive-polarity opposite junction surface part are disposed on a common first reference plane, and
end parts of the negative-polarity bus bar are provided so as to be located on the first reference plane.

* * * * *